(12) United States Patent
Ahrens et al.

(10) Patent No.: US 10,128,204 B2
(45) Date of Patent: Nov. 13, 2018

(54) RF MODULE

(71) Applicant: Infineon Technologies AG, Neubiberg (DE)

(72) Inventors: Carsten Ahrens, Munich (DE); Katharina Umminger, Wenzenbach (DE); Carsten von Koblinski, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/730,466

(22) Filed: Oct. 11, 2017

(65) Prior Publication Data

US 2018/0108622 A1    Apr. 19, 2018

(30) Foreign Application Priority Data

Oct. 14, 2016  (DE) .................. 10 2016 119 646
Sep. 1, 2017   (DE) .................. 10 2017 215 354

(51) Int. Cl.
| | |
|---|---|
| *H01L 21/70* | (2006.01) |
| *H01L 23/66* | (2006.01) |
| *H01L 23/522* | (2006.01) |
| *H01L 23/64* | (2006.01) |
| *H01L 25/11* | (2006.01) |

(52) U.S. Cl.
CPC .......... *H01L 23/66* (2013.01); *H01L 23/5222* (2013.01); *H01L 23/645* (2013.01); *H01L 25/112* (2013.01)

(58) Field of Classification Search
CPC ... H01L 23/66; H01L 23/5222; H01L 23/645; H01L 25/112
See application file for complete search history.

(56) References Cited

U.S. PATENT DOCUMENTS

| | | | |
|---|---|---|---|
| 2005/0030107 A1* | 2/2005 | Shimizu | H01L 23/66 330/307 |
| 2008/0308917 A1 | 12/2008 | Pressel et al. | |
| 2014/0145348 A1* | 5/2014 | Choi | H01L 24/95 257/774 |
| 2015/0243575 A1 | 8/2015 | Strothmann et al. | |
| 2015/0348821 A1 | 12/2015 | Iwanaga et al. | |
| 2016/0118353 A1 | 4/2016 | Ahrens et al. | |

* cited by examiner

*Primary Examiner* — Yosef Gebreyesus
(74) *Attorney, Agent, or Firm* — Slater Matsil, LLP

(57) ABSTRACT

In accordance with an embodiment, an RF module includes a bulk semiconductor substrate with at least one integrated RF component integrated in a first main surface region of the bulk semiconductor substrate; an insulator structure surrounding a side surface region of the bulk semiconductor substrate; a wiring layer stack including at least one structured metallization layer embedded into an insulation material, the wiring layer stack being arranged on the first main surface region of the bulk semiconductor substrate and a first main surface region of the insulator structure; and a carrier structure at a second main surface region of the insulator structure, wherein the carrier structure and the insulator structure include different materials.

25 Claims, 6 Drawing Sheets

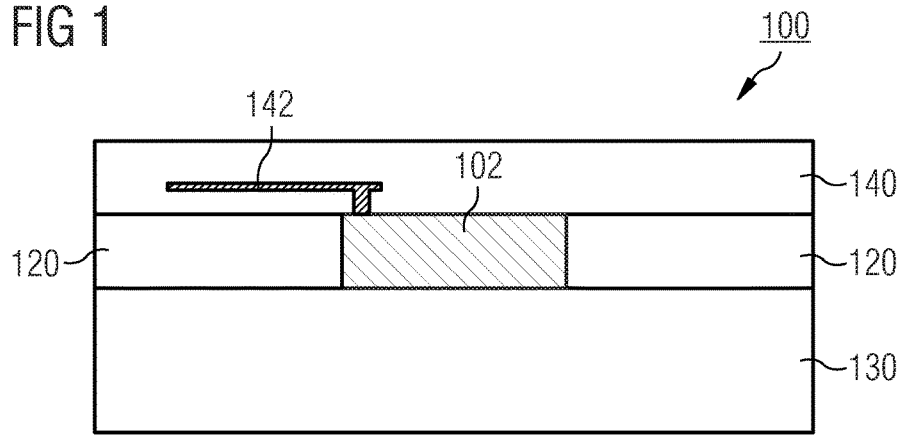
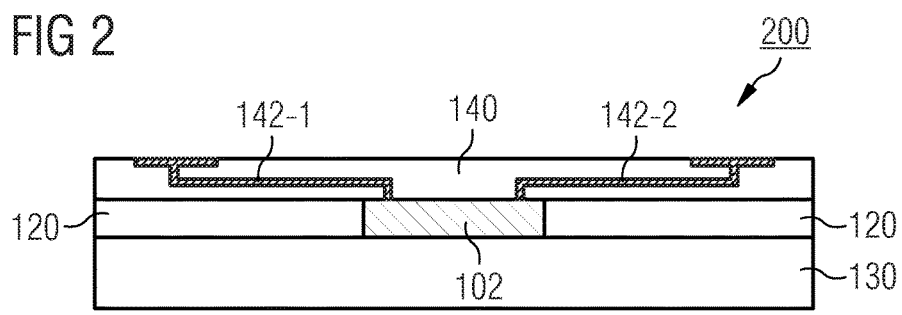
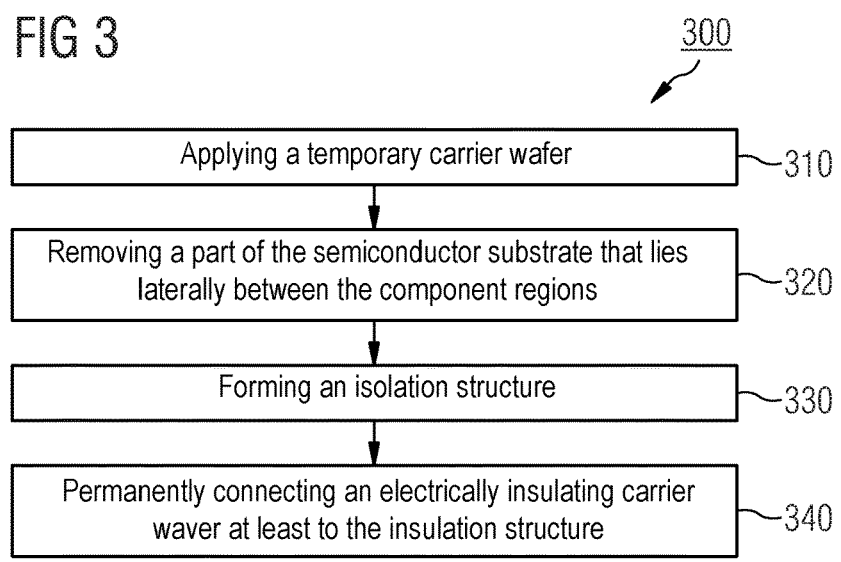

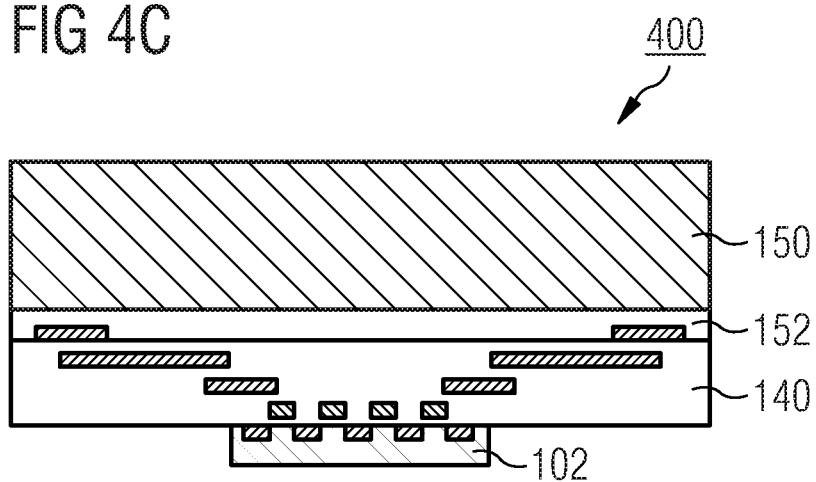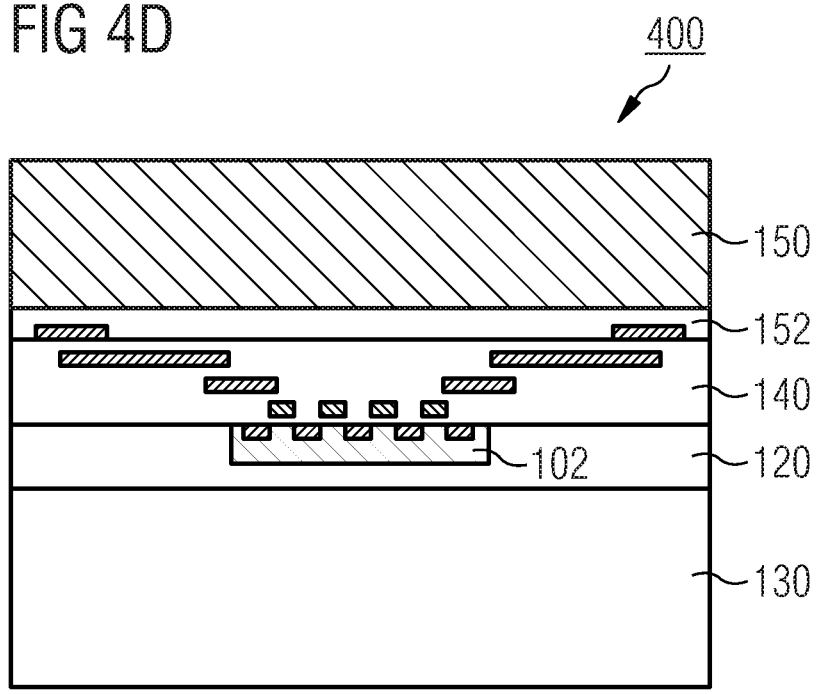

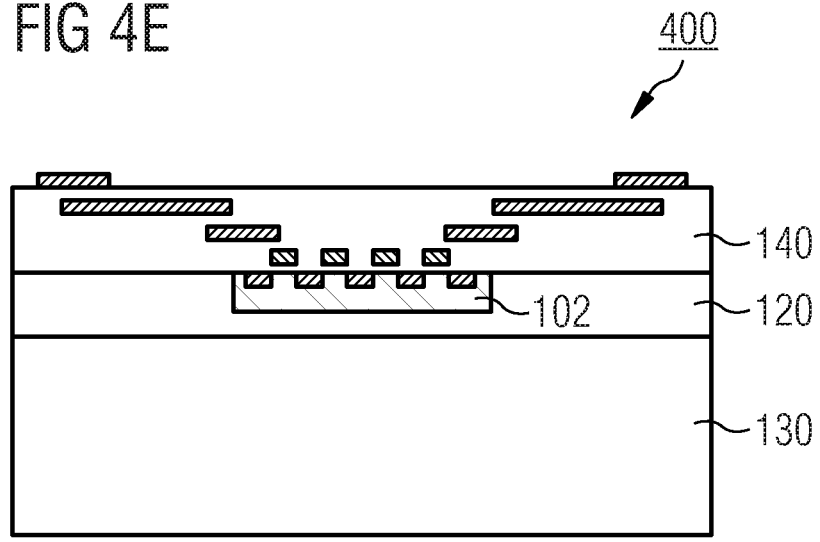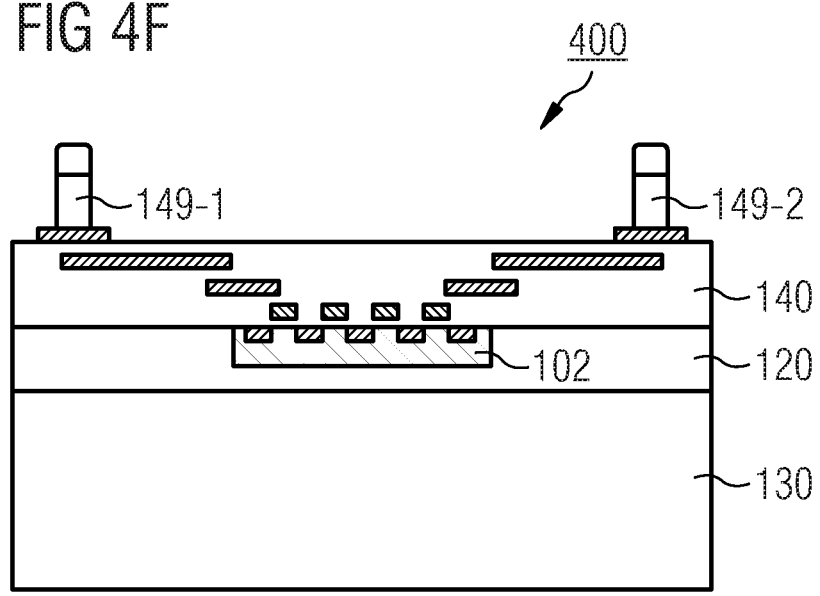

RF MODULE

This application claims priority to German Patent Application No. 102016119646.0, filed on Oct. 14, 2016 and German Patent Application No. 102017215354.7, filed on Sep. 1, 2017, which applications are hereby incorporated herein by reference in their entireties.

TECHNICAL FIELD

Exemplary embodiments relate to electrical insulation concepts of RF modules and, in particular, to RF modules and/or RF circuits having improved linearity and lower losses. Exemplary embodiments furthermore relate to electrical insulation concepts of semiconductor components and methods for producing semiconductor components.

BACKGROUND

The performance and also the operating properties of semiconductor components are limited inter alia by parasitic effects. Parasitic effects can impair both the static and the dynamic behavior of semiconductor components and, in particular, RF modules. By way of example, parasitic effects can lead to an increased power consumption and/or to a poorer switching and radio-frequency behavior of semiconductor components and reduce the signal integrity in semiconductor components. A reduction of parasitic effects is therefore desirable for a multiplicity of different applications.

SUMMARY

Exemplary embodiments relate to an RF module comprising a bulk semiconductor substrate with at least one integrated RF component, which is integrated in a first main surface region of the bulk semiconductor substrate, wherein the bulk semiconductor substrate furthermore comprises a second main surface region and a side surface region, an insulator structure which surrounds the side surface region of the bulk semiconductor substrate, wherein the insulator structure furthermore comprises a first and second opposite main surface region, a wiring layer stack comprising at least one structured metallization layer embedded into an insulation material, said wiring layer stack being arranged on the first main surface region of the bulk semiconductor substrate and the first main surface region—adjoining the latter—of the insulator structure, and a carrier structure at the second main surface region of the insulator structure, wherein the carrier structure and the insulator structure comprise different materials.

Exemplary embodiments furthermore relate to an RF module comprising a first, second and third layer structure arranged one above another in a stack, wherein the first layer structure comprises the bulk semiconductor substrate with at least one RF component integrated therein, and also an insulator structure, which regionally surrounds the bulk semiconductor substrate, wherein the second layer structure is a wiring layer stack comprising at least one structured metallization layer embedded in an insulation material, said wiring layer stack being arranged at the bulk semiconductor substrate and the insulator structure adjoining the latter, and wherein the third layer structure is a carrier structure, wherein the carrier structure and the insulator structure comprise different materials.

On account of the embedding of the bulk semiconductor substrate with the RF component integrated therein (at the second main surface region and the side surface region) in the insulator structure and at the first main surface region of the bulk semiconductor substrate with the (specially configured) wiring layer stack, it is possible to obtain an RF module having a very high linearity and very low losses of the RF circuit sections. In particular, by virtue of the present construction of the RF module, the capacitive and inductive interaction of the active and passive components among one another and via connecting elements with the semiconductor substrate can be prevented or at least reduced.

BRIEF DESCRIPTION OF THE DRAWINGS

Some exemplary embodiments of devices and/or methods are described below merely by way of example and with reference to the accompanying figures, in which FIG. 1 shows a schematic illustration of a cross section of a semiconductor component, e.g. of an RF module, in accordance with one exemplary embodiment;

FIG. 2 shows a schematic illustration of a cross section of a further semiconductor component, e.g. of a further RF module, in accordance with one exemplary embodiment;

FIG. 3 shows a flow diagram of a method for producing semiconductor components, e.g. RF modules;

FIGS. 4a-4g show schematic illustrations of a method for producing semiconductor components, e.g. RF modules;

DETAILED DESCRIPTION OF ILLUSTRATIVE EMBODIMENTS

Figure 4A:
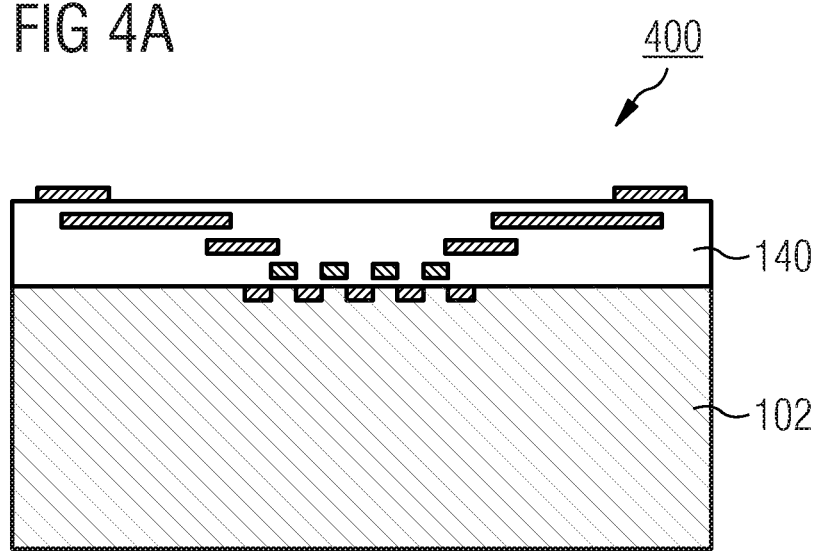

Various exemplary embodiments will now be described more thoroughly with reference to the accompanying drawings, in which some exemplary embodiments are illustrated. In the figures, the thicknesses of lines, layers and/or regions may be exaggerated for the purposes of elucidation.

While exemplary embodiments are suitable for various modifications and alternative forms, accordingly exemplary embodiments of same are shown by way of example in the figures and described thoroughly here. It goes without saying, however, that the intention is not to limit exemplary embodiments to the specific forms disclosed, rather on the contrary the exemplary embodiments are intended to cover all modifications, counterparts and alternatives that fall within the scope of the disclosure. Throughout the description of the figures, identical reference signs refer to identical or similar elements.

It goes without saying that if one element is designated as "connected" or "coupled" to another element, it can be connected or coupled directly to the other element or intermediate elements can be present. If, in contrast, one element is designated as "connected" or "coupled" directly to another element, no intermediate elements are present. Other expressions used for describing the relationship between elements should be interpreted in a similar way (e.g. "between" vis à vis "directly between", "adjacent" vis à vis "directly adjacent", etc.).

It furthermore goes without saying that if one element is designated as "arranged at, on, above, alongside, below or beneath another element", this element can be arranged directly at, on, above, alongside, below or beneath the other element or one or more intermediate elements can be present. If, in contrast thereto, one element is designated as arranged "directly" at, on, above, alongside, below or beneath another element, no intermediate elements are present. Furthermore, it is pointed out that the terms used "above or vertically above, alongside, below, beneath, laterally and vertically with respect to" refer to the relative arrangement of different elements with respect to one another in relation to the respectively illustrated plane of the drawing in the different figures and should be understood in accordance with the respective illustration.

Furthermore, the formulation "at least one" element should be understood to mean that one element or a plurality of elements can be provided.

The terminology used here is intended only to describe specific exemplary embodiments and is not intended to have a limiting effect for exemplary embodiments. According to usage herein, the singular forms "a, an" and "the" are also intended to encompass the plural forms, unless clearly indicated otherwise in the context. It furthermore goes without saying that the terms "comprises", "comprising", "have" and/or "having" in the usage herein indicate the presence of indicated features, integers, steps, operations, elements and/or constituents, but do not exclude the presence or addition of one or more other features, integers, steps, operations, elements, constituents and/or groups thereof.

Unless defined otherwise, all terms used here (including technical and scientific terms) have the same meaning as is normally understood by a person of average skill in the art in the field to which exemplary embodiments belong. Furthermore, it goes without saying that terms, e.g. those defined in dictionaries normally used, should be interpreted as having a meaning which corresponds to their meaning in the context of the corresponding technical area. However, if the present disclosure gives a term a specific meaning that deviates from a meaning such as is normally understood by a person of average skill in the art, said meaning should be taken into account in the specific context in which this definition is given.

Before exemplary embodiments of the present invention are explained more specifically in detail below with reference to the drawings, it is pointed out that identical functionally equivalent or identically acting elements, objects, functional blocks and/or method steps are provided with the same reference signs in the different figures, such that the description of said elements, objects, functional blocks and/or method steps (having the same reference signs) that is presented in different exemplary embodiments is mutually interchangeable or can be applied to one another. In the description below, the description of an element composed of a semiconductor material means that the element comprises a semiconductor material, i.e. is formed at least partly or else completely from the semiconductor material.

FIG. 1 shows a schematic illustration of a cross section of a semiconductor component 100 in accordance with one exemplary embodiment. The semiconductor component 100 comprises a semiconductor substrate 102 and an insulation structure 120. The insulation structure 120 encloses the semiconductor substrate 102 at least laterally. The semiconductor component 100 furthermore comprises an electrically insulating carrier structure 130. At least the insulation structure 120 is permanently connected to the electrically insulating carrier structure 130. The insulation structure 120 comprises electrically insulating material. The electrically insulating material of the insulation structure 120 extends laterally from an edge of the semiconductor substrate 102 as far as an edge of the electrically insulating carrier structure 130. The semiconductor component 100 furthermore comprises at least one wiring structure 142. The wiring structure 142 is arranged in a wiring layer stack 140 of the semiconductor component 100 and extends as far as the semiconductor substrate 102. A part of the wiring structure 142 is arranged vertically above the insulation structure 120.

By virtue of the implementation of an insulation structure which encloses a semiconductor substrate of a semiconductor component at least laterally, parasitic effects acting on the semiconductor component can be reduced and/or avoided and the semiconductor component can thus be improved with regard to its operating properties. Improvements can be achieved for example with regard to the electrical power consumption, the switching behavior, the radio-frequency behavior and/or the signal integrity within the semiconductor component. By way of example, parasitic capacitances and/or parasitic inductances in or at the semiconductor component could be reduced and/or an improvement in linear properties of the semiconductor component could be achieved. Furthermore, as a result of the use of an electrically insulating carrier structure, the robustness to withstand mechanical damage could be increased, while parasitic effects could be kept small.

The insulation structure 120 comprises for example an electrically insulating material or can consist predominantly (for example to the extent of more than 50%) or completely of an electrically insulating material. On account of the electrically insulating material, substantially no or—compared with the semiconductor substrate—only few free charge carriers (for example electrons and/or holes) can be present within the insulation structure 120, such that an interaction of such free charge carriers with the semiconductor substrate 102 and/or with wiring structures can be reduced. By virtue of the insulation structure 120, it is possible for example to reduce a lateral extent of an edge termination region (for example of a bulk region) at an edge of the semiconductor substrate 102, in which more free charge carriers can be present in comparison with the electrically insulating material of the insulation structure. Correspondingly, parasitic effects of the bulk region can be reduced. By virtue of the fact that the insulation structure 120 encloses the semiconductor substrate 102 at least laterally, a reduction or avoidance of parasitic effects can be achieved.

The semiconductor component 100 can be constructed such that the semiconductor substrate 102 and the insulation structure 120 are arranged on a front side surface of the electrically insulating carrier structure 130. In this case, the insulation structure 120 extends laterally from an edge of the semiconductor substrate 102 as far as an edge of the electrically insulating carrier structure 130. By way of example, the electrically insulating material of the insulation structure 120 can extend laterally along the entire edge of the electrically insulating carrier structure 130 and thus laterally completely enclose the semiconductor substrate. Furthermore, the electrically insulating material of the insulation structure 120 can extend vertically from the wiring layer stack (for example from a rear side surface of the wiring layer stack) as far as the electrically insulating carrier structure 130 (for example as far as the front side surface of the electrically insulating carrier structure 130). In this way, the insulation structure 120 can for example reduce parasitic effects acting on the semiconductor substrate 102 from outside the semiconductor component 100 and/or protect the semiconductor substrate 102 laterally against environmental influences (for example against moisture, high temperatures, low temperatures and/or electrostatic discharges). As a result, the semiconductor component 100 can for example dispense with a housing and thus reduce and/or avoid parasitic housing capacitances and/or connection inductances for example of a leadframe possibly required in the housing.

The electrically insulating carrier structure 130 can for example provide a sufficient mechanical stability of the semiconductor component 100 and thus enable a thinner semiconductor substrate 102 without risking fracture of the semiconductor component 100, for example. The electrically insulating carrier structure 130 can comprise an electrically insulating material or can consist predominantly (for example to the extent of more than 50%) or completely of an electrically insulating material. Compared with the semiconductor substrate 102, only few or substantially no free charge carriers can be present in the electrically insulating material of the electrically insulating carrier structure 130. By virtue of a thinner semiconductor substrate and/or by virtue of the reduced number of free charge carriers (or the absence of free charge carriers) within the electrically insulating carrier structure 130, parasitic effects acting in the semiconductor substrate 102 and/or on the semiconductor substrate 102 could be reduced. A rear side surface of the electrically insulating carrier structure 130 can be used for example for direct fixing on a printed circuit board (PCB for short) or a housing substrate (e.g. leadframe). The electrically insulating carrier structure 130 can serve to protect the semiconductor component 100 against environmental influences and could avoid the provision of a housing for the semiconductor component 100.

The wiring layer stack 140 of the semiconductor component 100 can be arranged on a front side surface of the semiconductor substrate 102 and on a front side surface of the insulation structure 120. A lateral total area of the wiring layer stack 140 can be substantially equal to a lateral total area of the semiconductor substrate 102 together with that of the insulation structure 120 (deviation for example less than 10% or equal in magnitude).

The wiring layer stack 140 comprises at least one wiring structure 142. The wiring structure 142 can comprise lateral wiring elements (for example conductor tracks and/or electrically conductive planes in one or more lateral wiring planes of the wiring layer stack) and/or vertical wiring elements (for example plated-through holes or vias in one or more vertical wiring planes of the wiring layer stack). The wiring structure 142 can be for example in (direct) contact with the semiconductor substrate 102 in order to produce an electrical contact with a doping region (e.g. source, body, drain, emitter, collector or base doping region of a transistor) in the semiconductor substrate. By way of example, the wiring structure 142 can contact a structure of an electrical element (for example a transistor, a diode and/or a capacitor) at the semiconductor substrate 102 and/or provide electrical connections between two or more structures of electrical elements. The at least one or a plurality of wiring structure(s) 142 or all wiring structures of the wiring layer stack 140 can be at least partly embedded into electrically insulating material of the wiring layer stack 140. The wiring layer stack 140 can protect the semiconductor substrate 102 against environmental influences at the front side surface of the semiconductor substrate 102. By way of example, the semiconductor substrate 102 can be completely enclosed by the wiring layer stack (at its front side surface), the electrically insulating carrier structure (at its rear side surface) and the insulation structure (at its vertical edge sides). By way of example, the provision of a housing for the semiconductor component 100 could be avoided. By way of example, the semiconductor component 100 could be a packageless semiconductor chip.

By virtue of the arrangement of at least one part of the wiring structure 142 vertically above the insulation structure 120 (for example above the electrically insulating material of the insulation structure 120), it is possible to reduce parasitic effects at the wiring structure 142. By virtue of the fact that for example the electrically insulating material of the insulation structure 120 can extend vertically from the wiring layer stack as far as the electrically insulating carrier structure 130 and, consequently, within the semiconductor component 100, only electrically insulating material can be arranged beneath at least one part of the wiring structure 142, it is possible to reduce for example a parasitic capacitance of the wiring structure 142 which might exist between the wiring structure 142 and electrically conductive material of the semiconductor component 100. Likewise, a parasitic inductance of the wiring structure 142 can also be reduced. On account of the reduced number of free charge carriers compared with that part of the wiring structure 142 which is arranged above the insulation structure 120, neither the insulation structure 120 nor the electrically insulating carrier structure 130 can act as a counterelectrode of a parasitic capacitor, nor can they form a parasitic conductor loop with said part of the wiring structure 142. This can reduce and/or avoid the parasitic capacitance and/or the parasitic inductance of the wiring structure 142.

The wiring structure 142 can comprise for example a contact connection area 146 (e.g. contact pad) arranged vertically above the insulation structure 120. The contact connection area can be arranged at a front side surface of the wiring layer stack 140 and provide an interface (or a part of an interface) to external electrical elements (for example to a printed circuit board, to a connection line, to other external semiconductor components and/or to passive external components). Arranging the contact connection area above the insulation structure 120 makes it possible to reduce a parasitic capacitance of the contact connection area. Since contact connection areas can often have larger lateral dimensions (for example a width more than five times greater) than for example conductor tracks of a wiring structure, parasitic capacitances of contact connection areas can be crucial for limitations of operating properties of the semiconductor component 100. Therefore, in particular the arrangement of the contact connection area of the wiring structure 142 (and also possibly of further contact connection areas of the semiconductor component 100) vertically above the insulation structure 120 can improve operating properties of the semiconductor component 100. A lateral total area of the contact connection area can be for example at least 100 µm$^2$ (or at least 1000 µm$^2$, or at least $1*10^4$ µm$^2$) and/or less than 1 mm$^2$ (or less than $5*10^4$ µm$^2$, or less than 5000 µm$^2$). A lateral shape of the contact connection area can be for example square, rectangular or circular.

A lateral total area of the electrically insulating carrier structure 130 can be for example equal to the lateral total area of the semiconductor substrate 102 together with the insulation structure 120. By way of example, a difference between the lateral total area of the electrically insulating carrier structure 130 and the lateral total area of the semiconductor substrate 102 together with the insulation structure 120 can be less than 10% (or less than 1%, or less than 1%) of the lateral total area of the electrically insulating carrier structure 130. The electrically insulating carrier structure 130 can thus extend laterally both beneath the entire semiconductor substrate 102 and beneath the entire insulation structure 120. By virtue of the absence—governed thereby within the semiconductor component 100—of electrically conductive material (which could bring about a great reduction of free charge carriers) beneath the semiconductor substrate and beneath that part of the wiring structure 140 which is arranged vertically above the insulation structure 120, it is possible to reduce and/or avoid parasitic effects in the semiconductor component 100 (for example charge-reversal processes and/or the movement of free charge carriers).

By way of example, a lateral total area of the semiconductor substrate 102 can be less than 80% (or less than 60%, or less than 50% or less than 30%) of the lateral total area of the electrically insulating carrier structure 130. By way of example, the lateral total area of the semiconductor substrate 102 can be greater than 20% (or greater than 40%, or greater than 5%, or greater than 70%, or greater than 9%) of the lateral total area of the electrically insulating carrier structure 130.

The lateral total area of the semiconductor substrate 102 relative to the lateral total area of the electrically insulating carrier structure 130 can thus be adapted to the semiconductor component 100 depending on the application. In one example, that part of the wiring structure 142 which is arranged vertically above the insulation structure 120 comprises a distributed passive microwave structure (such as, for example, a directional coupler, a power splitter, a frequency-dividing network and/or a stripline filter). The lateral dimensions of the distributed passive microwave structure can be predominantly determined by an operating frequency range of the semiconductor component 100. By way of example, a lateral extent of the distributed passive microwave structure (and/or of that part of the wiring structure 142 which is arranged vertically above the insulation structure 120) can be greater than one eighth of a wavelength assigned to an operating frequency of the semiconductor component 100 (for example approximately one quarter of the wavelength). Therefore, the wiring structure 142 in the case of a semiconductor component 100 having lower operating frequencies (for example less than 10 GHz) can have a larger lateral area requirement than in the case of a semiconductor component 100 having higher operating frequencies (for example greater than 10 GHz). Correspondingly, in the case of a semiconductor component 100 having lower operating frequencies, the lateral total area of the semiconductor substrate 102 can be smaller relative to the lateral total area of the electrically insulating carrier structure 130, such that the lateral total area of the insulation structure 120 can become larger and more lateral area can be available for a distributed passive microwave structure vertically above the insulation structure 120.

Additionally or alternatively, that part of the wiring structure 142 which is arranged vertically above the insulation structure 120 can comprise a passive electrical component structure (or a plurality of passive electrical component structures) (for example a resistance structure, an inductance structure and/or a capacitor structure). Passive electrical component structures can be for example to implement passive circuit parts (such as, for example, filters, resonance and/or bias networks) for the semiconductor component 100. By way of example, the semiconductor component 100 can comprise a power component, such as a switching regulator, for example, at the output of which a low-pass filter realized with passive component structures can be arranged. By arranging the passive component structures vertically above the insulation structure 120 and above the electrically insulating carrier structure, it is possible to reduce and/or avoid parasitic effects at the passive component structures (such as, for example, parasitic inductances and/or parasitic capacitances). This can bring about an improvement of the passive circuit parts realized with the passive component structures. By way of example, a steeper filter slope and/or a higher stop-band attenuation can be achieved in this way for the low-pass filter mentioned by way of example above. Therefore, relative to the lateral total area of the electrically insulating carrier structure 130, the lateral total area of the insulation structure 120 and thus the lateral total area of the semiconductor substrate 102 can be designed differently and be of different magnitudes depending on the number and size of the passive component structures.

By way of example, the semiconductor component 100 can be a power semiconductor component or comprise an electrical power component structure. A power semiconductor component or an electrical power component structure can have for example a breakdown voltage or reverse voltage of more than 10 V (e.g. a breakdown voltage of 10 V, 20 V or 50 V), more than 100 V (e.g. a breakdown voltage of 200 V, 300 V, 400 V or 500 V) or more than 500 V (e.g. a breakdown voltage of 600 V, 700 V, 800 V or 1000 V) or more than 1000 V (e.g. a breakdown voltage of 1200 V, 1500 V, 1700 V or 2000 V).

In another example, the semiconductor component 100 comprises a digital logic circuit and can be constructed without distributed passive microwave structures described above or without passive electrical component structures. This example can predominantly involve reducing parasitic capacitances of contact connection areas of the semiconductor component 100. To that end, the contact connection areas of the semiconductor component 100 can be arranged vertically above the insulation structure 120. Since a lateral total area of the contact connection areas can be small compared with a lateral total area of the semiconductor substrate 102, the lateral total area of the semiconductor substrate 102 can extend over a significant part of the electrically insulating carrier structure 130 (for example over more than 90% of the lateral total area of the electrically insulating carrier structure 130).

A minimum width of the insulation structure 120 can be for example greater than 500 μm (or greater than 1 mm, or greater than 3 mm) and/or can be less than 1 cm (or less than 5 mm, or less than 1 mm). By virtue of such a minimum width of the insulation structure 120, it is possible to provide for example a lateral minimum area of the insulation structure 120 laterally around the semiconductor substrate, above which wiring structures (such as, for example, contact connection areas) of the wiring layer stack can be provided. Moreover, by virtue of such a minimum width of the insulation structure 120, it is possible to provide a lateral electrical insulation of the semiconductor substrate 102 and a lateral protection against environmental influences of the semiconductor substrate 102.

The width of the insulation structure 120 can be a lateral extension of the insulation structure 120 from the edge of the semiconductor substrate 102 as far as the edge of the electrically insulating carrier structure 130. The width of the insulation structure 120 can vary. By way of example, on one side of the semiconductor substrate 102 a lateral extension of the insulation structure 120 from the edge of the semiconductor substrate 102 as far as the edge of the electrically insulating carrier structure 130 can be different than a lateral extension of the insulation structure 120 on another side of the semiconductor substrate 102. The minimum width of the insulation structure 120 can be the smallest lateral extension of the insulation structure 120 from the edge of the semiconductor substrate 102 as far as the edge of the electrically insulating carrier structure 130.

In other words, the insulation structure 120 can comprise a ring-shaped and/or a looped lateral cross section, in the center of which the semiconductor substrate 102 can be arranged laterally. A width of the insulation structure 120 can be for example a difference between the external radius and the internal radius of the ring-shaped and/or looped lateral cross section of the insulation structure 120.

Optionally, a part of the insulation structure 120 can be arranged vertically between the semiconductor substrate 102 and the electrically insulating carrier structure 130. By way of example, that part of the insulation structure 120 which is arranged vertically between the semiconductor substrate 102 and the electrically insulating carrier structure 130 can have high adhesion properties to the semiconductor substrate 102 and to the electrically insulating carrier structure 130 and can thus provide a permanent and reliable mechanical connection between the semiconductor substrate 102 and the electrically insulating carrier structure 130.

A thickness of that part of the insulation structure 120 which is arranged vertically between the semiconductor substrate 102 and the electrically insulating carrier structure 130 can be for example less than 50 μm (or less than 25 μm, or less than 10 μm, or less than 5 μm) and/or greater than 1 μm (or greater than 5 μm, or greater than 10 μm).

A lateral total extent of that part of the insulation structure 120 which is arranged vertically between the semiconductor substrate 102 and the electrically insulating carrier structure 130 can for example be substantially equal to a lateral total extent of the semiconductor substrate 102 (deviation less than 1%). By way of example, that part of the insulation structure 120 which is arranged vertically between the semiconductor substrate 102 and the electrically insulating carrier structure 130 can cover completely (or partly) the rear side surface of the semiconductor substrate 102.

The electrically insulating material of the insulation structure 120 can comprise for example benzocyclobutene (BCB for short), polymer-based molding material, glass solder, glass frit, silicon dioxide ($SiO_2$), silicon nitride (SiN) and/or carbon.

The electrically insulating material of the insulation structure 120 can consist predominantly (e.g. to the extent of more than 50%, or to the extent of more than 90%) or completely of an organic electrically insulating material, such as, for example, benzocyclobutene, and/or of an inorganic electrically insulating material, such as, for example, glass solder, glass frit, silicon dioxide and/or silicon nitride, and/or of an electrically insulating composite material, such as, for example, polymer-based molding material and/or carbon. These electrically insulating materials can be distinguished for example by high electrical insulation properties up to high frequencies (for example frequencies of greater than 10 GHz), by a low dielectric loss factor up to high frequencies (for example tan(δ) less than 90%), by good filling and moldability properties, and/or by high adhesion properties to the semiconductor substrate 102 and/or to the electrically insulating carrier structure 130. Moreover, at least some of these electrically insulating materials can form a mechanical (hard) abutment for the wiring layer stack 140. Furthermore, these electrically insulating materials can be resistant to heat (for example temperatures of greater than 200° C.), to moisture and/or to corrosion processes and, consequently, can be qualifiable materials.

A polymer-based molding material can comprise for example a polymer matrix provided with ceramic particles. Polymer-based molding material can be readily moldable, mechanically robust (ductile), corrosion-resistant and cost-effective.

Inorganic electrically insulating materials of the insulation structure 120 (such as, for example, glass solder, glass frit, silicon dioxide and/or silicon nitride) can be comparatively hard and thus provide a mechanical abutment for the wiring layer stack 140.

Furthermore, the insulation structure 120 can be constructed from a combination of the materials mentioned above. By way of example, a part of the insulation structure 120 above which no wiring structures are arranged can consist of silicon dioxide in order to provide an improved mechanical abutment, while that part of the insulation structure 120 which is arranged vertically beneath the wiring structure 142 can consist of benzocyclobutene in order to minimize parasitic effects and losses at the wiring structure 142. Optionally, for example, polymer-based molding material can extend laterally along the edge of the electrically insulating carrier structure 130 and provide an increased protection of the semiconductor substrate 102 and/or of the semiconductor component 100 against external environmental influences.

An (electrically insulating) material of the electrically insulating carrier structure 130 can be for example different than the electrically insulating material of the insulation structure 120. In this regard, by way of example, it is possible to utilize opposing material properties of the material of the electrically insulating carrier structure 130 and of the material of the insulation structure 120 for the semiconductor component 100. If for example the insulation structure 120 is embodied with polymer-based molding material, for example the electrically insulating carrier structure 130 can be embodied with a thermally conductive material (for example aluminum nitride, AlN) in order for example to be able to dissipate heat loss that arises during the operation of the semiconductor component 100 at the semiconductor substrate 102.

The electrically insulating carrier structure 130 can comprise for example glass (for example amorphous silicon dioxide) and/or crystalline material.

The electrically insulating carrier structure 130 can for example consist at least predominantly (e.g. to the extent of more than 50%, or to the extent of more than 90%) or completely of glass and/or a crystalline material. The crystalline material can be monocrystalline or polycrystalline. The crystalline material can comprise for example an intrinsic semiconductor material (for example silicon) or ceramic materials, such as aluminum nitride, sapphire and/or aluminum oxide ($Al_2O_3$). Aluminum nitride, aluminum oxide and sapphire are distinguished for example by high electrical insulation properties, high electrical breakdown strengths and also by low dielectric loss factors. Amorphous silicon dioxide likewise comprises high electrical insulation properties and can be cost-effective compared with aluminum nitride, aluminum oxide and/or sapphire.

A thickness of the semiconductor substrate 102 can be for example less than 200 μm (or less than 100 μm, or less than 50 μm, or less than 25 μm). In the case of such a thin semiconductor substrate 102, for example the thickness of a bulk region at a rear side surface of the semiconductor substrate can be reduced (for example be less than 30 μm). The rear side surface of the semiconductor substrate 102 denotes for example the lateral side of the semiconductor substrate 102 facing the electrically insulating carrier structure 130. By way of example, the mechanical stability could already be significantly improved by the electrically insulating carrier structure 130. By virtue of the resulting thinner possible bulk region in the semiconductor substrate 102 of the semiconductor component 100, it is possible to reduce a number of free charge carriers outside regions of structures of electrical elements (such as, for example, drain regions, source regions, channel regions, drift regions, etc.), such that parasitic effects caused by free charge carriers could also be reduced and/or avoided.

In the bulk region, the semiconductor substrate 102 can have for example a doping concentration of less than $1*10^{15}$ cm$^{-3}$ (or less than $1*10^{14}$ cm$^{-3}$, or less than $1*10^{13}$ cm$^{-3}$). Alternatively, the bulk region can comprise intrinsic semiconductor material. By virtue of this low doping concentration or by virtue of the absence of dopants in the bulk region, parasitic effects proceeding from the bulk region of the semiconductor substrate 102 can be reduced and/or avoided. The bulk region can extend for example vertically from the rear side surface of the semiconductor substrate 102 into the semiconductor substrate 102 and comprise for example a thickness of greater than 5 µm and/or less than 30 µm. Laterally, the bulk region can extend from the edge of the semiconductor substrate 102 into the semiconductor substrate 102 and comprise a lateral extent of greater than 5 µm and/or less than 30 µm for example at the edge of the semiconductor substrate 102. The bulk region can comprise for example a part of the semiconductor substrate between the edge of the semiconductor substrate (and/or the rear side of the semiconductor substrate) and doping regions (such as, for example, drain, source, channel, emitter, collector, base regions).

For a sufficient mechanical stability of the semiconductor component 100 and/or of a semiconductor wafer from which the semiconductor component 100 can be produced, a thickness of the electrically insulating carrier structure 130 can be greater than 250 µm (or at least 375 µm, or at least 525 µm, or at least 675 µm, or at least 775 µm) and/or can be less than 950 µm (or less than 730 µm, or less than 630 µm, or less than 530 µm, or less than 280 µm).

Optionally, during the production of the semiconductor component 100, after a step of singulating the semiconductor component 100 from the semiconductor wafer, the electrically insulating carrier structure 130 can be thinned proceeding from its rear side surface. In this regard, by way of example, a thickness of less than 200 µm (or less than 100 µm) of the electrically insulating carrier structure 130 can be achieved. A smaller thickness of the electrically insulating carrier structure 130 can lead to a smaller thickness of the semiconductor component 100. A small thickness of the semiconductor component 100 (for example less than 250 µm, or less than 150 µm) can enable for example shorter bond wires which can be utilized for electrically connecting the semiconductor component 100 to a printed circuit board, for example, such that parasitic inductances of the bond wires can be reduced.

The semiconductor component 100 can comprise for example a microwave circuit implemented at least partly in the semiconductor substrate. In one example, the semiconductor component 100 comprises (or is) a monolithic microwave circuit (referred to as Monolithic Microwave Integrated Circuit, MMIC). Microwave circuits often comprise both active circuit parts (such as, for example, transistor structures) and passive circuit parts (such as, for example, distributed passive microwave structures and/or passive electrical component structures). Microwave circuits can comprise for example amplifier circuits (for example low noise preamplifier circuits and/or power amplifier circuits), mixer circuits, oscillator circuits, radio-frequency switches, and/or transmitting and/or receiver circuits. Microwave circuits can be used for example at operating frequencies of greater than 1 GHz, or greater than 10 GHz, or greater than 30 GHz (for example in the millimeter waveband). Furthermore, they can operate in waveguide frequency bands, for example in the U-band (40 GHz to 60 GHz), in the V-band (50 GHz to 75 GHz), in the E-band (60 GHz to 90 GHz), in the W-band (75 GHz to 110 GHz), and/or in frequency bands going beyond 110 GHz.

At passive circuit parts of microwave circuits, parasitic effects, such as, for example, parasitic capacitances and/or parasitic inductances, can impair operating properties such as, for example, bandwidth, insertion loss, frequency response, power matching, filter slope gradient and/or stopband suppression. In the frequency ranges mentioned above, for example small capacitance values (for example less than 10 pF, or less than 1 pF) and small inductance values (for example less than 10 nH, or less than 1 nH) may often be required in order to realize passive circuit parts. Therefore, parasitic capacitances and/or parasitic inductances that can be of a similar order of magnitude in the case of other semiconductor components can considerably impair the operating properties mentioned. By reducing these parasitic effects in the semiconductor component 100, it is possible to achieve a larger bandwidth, a lower insertion loss, a more even frequency response, a higher power matching, a higher filter slope gradient and/or a higher stop-band suppression for example for passive circuit parts of the semiconductor component 100.

At active circuit parts of microwave circuits, parasitic effects can comprise for example charge-reversal processes and/or movement of free charge carriers in semiconductor regions that can be present outside regions of structures of electrical elements (for example in a bulk region). In other semiconductor components, such processes can impair for example operating properties such as linearity, signal gain, signal attenuation and/or electrical insulation limits. By reducing free charge carriers outside regions of structures of electrical elements (for example through the insulation structure 120 and/or through the electrically insulating carrier structure 130), it is possible for the semiconductor component 100 to have for example a higher linearity, higher signal gains, lower signal attenuations and/or higher electrical insulation limits.

In a further example, the semiconductor component 100 comprises (or is) a digital logic circuit, for example a processor. The electrical power consumption of a digital logic circuit is often determined by switching processes (for example in the case of a change of logic signal levels). Said switching processes generally comprise charge-reversal of capacitances (for example of gate capacitances). By reducing parasitic capacitances in the semiconductor component 100, it is possible to reduce charge-reversal currents during the switching processes, such that the semiconductor component 100 can operate with a lower electrical power. Furthermore, the smaller charge-reversal currents in the semiconductor component 100 enable temporally shorter charge-reversal processes, such that the semiconductor component 100 can operate for example with a higher clock frequency. The operating properties of the semiconductor component 100 that are improved here thus relate to the electrical power consumption and/or to the maximum possible clock frequency.

The semiconductor substrate 102 of the semiconductor component 100 can be for example a silicon substrate, a silicon carbide substrate, a gallium arsenide substrate or a gallium nitride substrate. A surface (e.g. front side surface or main surface) of the semiconductor substrate can be a semiconductor surface of the semiconductor substrate in the direction of metal layers, insulation layers or passivation layers at the top on the semiconductor surface. In comparison with a fundamentally vertical edge of the semiconductor substrate, the surface of the semiconductor substrate can be a fundamentally horizontal surface which extends laterally. The surface of the semiconductor substrate can be a fundamentally level plane (e.g. disregarding an unevenness of the semiconductor structure on account of the production process or trenches). By way of example, the front side surface of the semiconductor substrate can be the interface between the semiconductor material and an insulation layer, metal layer and/or passivation layer of the wiring layer stack at the top on the semiconductor substrate.

By way of example, a lateral direction, lateral extension and/or lateral dimension (for example lengths and widths) can be a direction, orientation or extent substantially parallel to the front side surface or rear side surface of the semiconductor substrate 102. If reference is made to a length and/or to a width of a region, of an area, of a zone, of a structure, of a ply and/or of a layer, then the length denotes the longer lateral dimension and the width denotes the shorter lateral dimension of the region, of the area, of the zone, of the structure, of the ply and/or of the layer. A vertical direction, vertical extension, vertical dimension (for example depths) and/or thicknesses of a region, of a zone, of a structure, of a ply and/or of a layer can be for example a direction, orientation or extent substantially orthogonal or perpendicular to the front side surface or rear side surface of the semiconductor substrate 102.

FIG. 2 shows a schematic illustration of a cross section of a further semiconductor component 200 in accordance with one exemplary embodiment. The semiconductor component 200 is similar to the semiconductor component 100 from FIG. 1.

The semiconductor component 200 comprises a first wiring structure 142-1 and a second wiring structure 142-2. Both a part of the first wiring structure 142-1 and a part of the second wiring structure 142-2 are arranged vertically above an insulation region 120. In particular, the first wiring structure 142-1 comprises a first contact connection area, which is arranged vertically above the insulation region 120, and the second wiring structure 142-2 comprises a second contact connection area, which is likewise arranged vertically above the insulation region 120. By virtue of the arrangement of the first contact connection area and the second contact connection area vertically above the insulation region 120, parasitic capacitances of the first contact connection area and of the second contact connection area could be reduced. The contact connection areas can comprise electrically conductive material and serve for connecting the semiconductor component 200 to external electrical structures. Furthermore, the semiconductor component 200 can comprise more than two wiring structures (or more than five, or more than ten, or more than one hundred wiring structures), which can have contact connection areas arranged vertically above the insulation region 120 and could thus have reduced parasitic capacitances.

Furthermore, FIG. 2 shows a structure comprising four basic elements of one exemplary embodiment of the present disclosure. The structure disclosed is based on a combination of four basic parts (or elements) of a chip (for example of the semiconductor component 200) and can extend across many possible methods of realization. The four basic parts can be and/or comprise:

A first basic part of the structure comprises active radio-frequency semiconductor components (for example the semiconductor substrate 102) having a top side (for example front side surface), an underside (for example rear side surface) and a periphery (for example the bulk region of the semiconductor substrate 102).

A second basic part of the structure comprises radio-frequency insulating material (for example the insulation structure 120) around the periphery of the components (for example of the active radio-frequency semiconductor components).

A third basic part of the structure comprises top side connections (for example wiring structures of the wiring layer stack 140) extending above insulating material (for example the radio-frequency insulating material).

A fourth basic part of the structure comprises a radio-frequency insulation carrier (for example the electrically insulating carrier structure 130) applied at an underside (for example the rear side surface) of the components (for example of the active radio-frequency semiconductor components) and the surrounding insulating material (for example the radio-frequency insulating material).

One feature of the present disclosure is that no free charge carriers are present outside the active component region (for example outside the semiconductor substrate 102), which charge carriers might otherwise contribute to nonlinearities, losses and/or insulation restrictions. The semiconductor component 200 could for example greatly influence the design of systems since the structure disclosed could enable a higher component-to-component insulation and/or a breakthrough in the performance of radio-frequency circuits, which could enable new system architectures. The disclosure could provide for example a basic structure (for example a basic concept for the construction of semiconductor components) for future high-end radio-frequency products in the fields of switches, low noise preamplifiers and/or in the millimeter waveband.

Linearity and/or low losses may be key factors in the technical performance of advanced radio-frequency circuits. Limiting factors might stem from active and passive components (for example circuit parts) and from a capacitive and/or inductive interaction among said components and/or between connections (for example wiring structures) and the semiconductor substrate. Exemplary embodiments of the present disclosure could provide a basic reduction of interactions with the substrate (for example the semiconductor substrate 102).

Further details and aspects are mentioned in connection with the exemplary embodiments described above or below. The exemplary embodiments shown in FIG. 2 can have one or more optional additional features corresponding to one or more aspects mentioned in connection with the proposed concept or one or more exemplary embodiments described above (e.g. FIG. 1) or below (e.g. FIGS. 3 to 4g).

FIG. 3 shows a flow diagram of a method 300 for producing a semiconductor component according to one exemplary embodiment. The method 300 comprises applying 310 a temporary carrier wafer on a front side of a semiconductor wafer. The semiconductor wafer has at the front side a wiring layer stack arranged on a semiconductor substrate. The semiconductor substrate has a plurality of component regions. The method 300 furthermore comprises removing 320 a part of the semiconductor substrate that lies laterally between the component regions, such that the wiring layer stack is exposed between the component regions. The method 300 furthermore comprises forming 330 an insulation structure. The insulation structure is arranged at least laterally between the component regions and laterally encloses the component regions. The method 300 furthermore comprises permanently connecting 340 an electrically insulating carrier wafer at least to the insulation structure at an opposite side of the component regions relative to the wiring layer stack.

By providing an insulation structure which is arranged at least laterally between the component regions and laterally encloses the component regions, semiconductor components could be produced in which the action of parasitic effects could be reduced and/or avoided and which could be improved with regard to their operating properties.

The temporary carrier wafer can be for example a glass wafer, a silicon wafer or a film (for example a supporting film) and can have for example a thickness of greater than 250 µm and/or less than 1 mm. Applying 310 the temporary carrier wafer to the semiconductor wafer can be carried out for example by means of a reversible lacquer and/or a double-sided adhesive film, such that the carrier wafer (for example after permanently connecting 340 the electrically insulating carrier wafer to at least the insulation structure) can be detached again from the front side of the semiconductor wafer. The detachment can be carried out for example by supplying heat or by using a solvent (for example acetone). While the temporary carrier wafer is applied to the semiconductor wafer, the temporary carrier wafer could for example ensure a sufficient mechanical stability of the semiconductor wafer and avoid fracture of the semiconductor wafer, in particular during and/or after removing 320 the part of the semiconductor substrate that lies laterally between the component regions, and/or during (and/or after) optional thinning of the semiconductor substrate of the semiconductor wafer proceeding from the rear side surface of the semiconductor substrate.

A component region of the plurality of component regions can comprise for example at least one and/or all of the structures of electrical elements (for example transistor structures and/or diode structures) which can be arranged at a front side surface of the semiconductor substrate 102 and which are comprised for example by a specimen of the semiconductor component to be produced. A component region can correspond for example to the semiconductor substrate 102 of the semiconductor component 100 from FIG. 1.

The wiring layer stack arranged on the semiconductor substrate of the semiconductor wafer can comprise for example at least one wiring structure. The at least one wiring structure can extend at least as far as a component region and/or contact the latter. A part of the at least one wiring structure can be arranged vertically above the part of the semiconductor substrate that lies laterally between the component regions. The at least one wiring structure can comprise a contact connection area at a front side surface of the wiring layer stack.

After applying 310 the temporary carrier wafer on the front side of the semiconductor wafer, it is possible to turn over the semiconductor wafer, for example, such that its rear side (and the semiconductor substrate of the semiconductor wafer) can face upward and the semiconductor wafer could be supported by the temporary carrier wafer.

Optionally after applying 310 the temporary carrier wafer and before removing 320 the part of the semiconductor substrate that lies laterally between the component regions, the semiconductor substrate of the semiconductor wafer can be thinned to a thickness of the semiconductor substrate of less than 200 µm (or less than 100 µm, or less than 50 µm, or less than 25 µm), in order to be able to provide a thin semiconductor substrate having a thin bulk region (for example thinner than 30 µm, or thinner than 10 µm) at the rear side surface of the semiconductor substrate for the semiconductor component to be produced and in order thus to be able to reduce the number of free charge carriers that bring about parasitic effects in a region outside structures of electrical elements of the semiconductor substrate. Thinning the semiconductor substrate can comprise for example grinding, polishing and/or etching.

After optionally thinning the semiconductor substrate and before forming 330 the insulation structure, there may be no electrically insulating material (such as e.g. silicon dioxide and/or silicon nitride) present at the rear side surface of the semiconductor substrate (at the opposite side of the component regions relative to the wiring layer stack). Instead, after thinning the semiconductor substrate and before forming 330 the insulation structure, the rear side surface of the semiconductor substrate may comprise an interface between semiconductor material of the semiconductor substrate (e.g. highly resistive silicon) and air.

Removing 320 the part of the semiconductor substrate that lies laterally between the component regions can comprise for example forming a (photolithographic) mask and anisotropic etching (for example wet etching or dry etching). After removing 320 the part of the semiconductor substrate that lies laterally between the component regions, the wiring layer stack may be exposed (for example not covered by solid materials) at its rear side surface between the component regions. In particular, no conductive and/or no semiconducting material might be situated laterally between the component regions (directly) at the rear side surface of the wiring layer stack.

Forming 330 the insulation structure, which subsequently is arranged at least laterally between the component regions and laterally encloses the component regions, can comprise for example spin coating (referred to as Spin-On), a chemical vapor deposition and/or a physical vapor deposition. Optionally, a part of the insulation structure can additionally be formed at the rear side surface of the component regions (at the opposite side of the component regions relative to the wiring layer stack) and cover the latter. A thickness of the part of the insulation structure at the rear side surface of the component regions can for example be less than 50 µm (or less than 25 µm, or less than 10 µm, or less than 5 µm) and/or greater than 1 µm (or greater than 5 µm, or greater than 10 µm).

After forming 330 the insulation structure, a part of the at least one wiring structure of the wiring layer stack can be arranged vertically above the insulation structure formed. If the wiring structure comprises a contact connection area, for example, then the contact connection area can be arranged vertically above the insulation structure formed.

During the process of permanently connecting 340 the electrically insulating carrier wafer to at least the insulation structure, the insulation structure can optionally be in a viscous state at the opposite side of the component regions relative to the wiring layer stack (at a rear side surface of the insulation structure) and cure during the process of permanently connecting. This manner of permanently connecting 340 could be employed, for example, if the electrically insulating material of the insulation structure comprises benzocyclobutene, polymer-based molding material, glass solder and/or glass frit. By way of example, the electrically insulating material of the insulation structure could still be in a viscous state during the process of forming 330 said insulation structure and during the process of permanently connecting 340 and/or could be brought to a viscous state for example by the supply of heat. The insulation structure could then provide a permanent connection to the electrically insulating carrier wafer (and/or provide a permanent connection between the semiconductor wafer and the electrically insulating carrier wafer) as a result of curing. A part of the insulation structure that is optionally formed at the rear side surface of the component regions could make the permanent connection more stable and more reliable and/or provide additional support in preventing delamination of the electrically insulating carrier wafer from the semiconductor wafer.

Alternatively, the electrically insulating carrier wafer can be permanently connected to at least the insulation structure by wafer bonding methods (for example by direct bonding, anodic bonding, eutectic bonding, glass frit bonding, and/or adhesive bonding). Wafer bonding methods can be employed for example for the process of permanently connecting 340 if the insulation structure comprises inorganic electrically insulating materials (such as, for example, silicon dioxide, silicon nitride, glass solder and/or glass frit).

Optionally, the insulation structure can be planarized (for example by polishing and/or grinding) at its rear side surface (at its interface with the electrically insulating carrier wafer) before the process of permanently connecting 340. Planarizing the insulation structure can bring about, for example, a more reliable process of permanently connecting 340 the electrically insulating carrier wafer to at least the insulation structure.

After the process of permanently connecting 340 the electrically insulating carrier wafer to at least the insulation structure, it is possible for example to remove the temporary carrier wafer from the front side of the semiconductor wafer, since the mechanical stability of the semiconductor wafer could then be provided by the electrically insulating carrier wafer.

In addition, the method 300 can comprise singulating the semiconductor components by separation in a region of the insulation structure. A separating line, along which separation can be carried out in order to singulate the semiconductor components from the composite assembly of the semiconductor wafer and the electrically insulating carrier wafer, can run for example through a part of the insulation structure which laterally encloses a component region of the semiconductor substrate of the semiconductor wafer. After singulating, the component region separated out then corresponds to a semiconductor substrate of the singulated semiconductor component. A separated-out part of the electrically insulating carrier wafer corresponds to an electrically insulating carrier structure of the singulated semiconductor component. A part of the insulation structure of the semiconductor wafer which is situated between the separating line and the component region prior to singulating corresponds to the insulation structure of the singulated semiconductor component. The insulation structure of the singulated semiconductor component can then extend laterally from an edge of the semiconductor substrate of the singulated semiconductor component as far as an edge of the electrically insulating carrier structure of the singulated semiconductor component. Furthermore, a part of the wiring layer stack of the semiconductor wafer which is enclosed laterally by the separating line prior to singulating corresponds to a wiring layer stack of the singulated semiconductor component.

The wiring layer stack of the semiconductor wafer can comprise a wiring structure, which contacts the component region (for example transistor and/or diode structures) and which is arranged at least partly vertically above that part of the insulation structure of the semiconductor wafer which is laterally enclosed by the separating line. After singulating, said wiring structure of the wiring layer stack of the semiconductor wafer can then correspond to a wiring structure of the singulated semiconductor component, which wiring structure is arranged vertically above the insulation structure of the singulated semiconductor component and contacts the semiconductor substrate (for example transistor and/or diode structures) of the singulated semiconductor component. What could be achieved in this manner of singulating, for example, is that substantially no free charge carriers bringing about parasitic effects can be situated outside the semiconductor substrate of the singulated semiconductor component (and outside wiring structures of the singulated semiconductor component), such that the singulated semiconductor component could be improved in at least some of its operating properties.

Further details and aspects are mentioned in connection with the exemplary embodiments described above or below. The exemplary embodiments shown in FIG. 3 can have one or more optional additional features corresponding to one or more aspects mentioned in connection with the proposed concept or one or more exemplary embodiments described above (e.g. FIGS. 1 to 2) or below (e.g. FIGS. 4a to 4g).

FIGS. 4a to 4g show in schematic illustration a sequence of method steps of a method for producing semiconductor components. The method presented in FIGS. 4a to 4g can be similar to the method 300 from FIG. 3.

FIG. 4a schematically shows a cross section of a part of a semiconductor wafer 400 before applying a temporary carrier wafer. The semiconductor wafer 400 comprises a semiconductor substrate 102 and a wiring layer stack 140 at a front side of the semiconductor wafer 400. A component region of the semiconductor substrate 102 is arranged at a front side surface of the semiconductor substrate 102. The component region is laterally enclosed by a part of the semiconductor substrate 102 which comprises no structures of electrical elements and can correspond for example to a bulk region of the semiconductor substrate 102. This part of the semiconductor substrate 102 can be arranged for example laterally between the illustrated component region and at least one further component region (not shown in FIG. 4a) of the semiconductor wafer 400.

Moreover, a part of the bulk region can be arranged vertically between a rear side surface of the semiconductor substrate 102 and the component region. The bulk region could for example provide a mechanical stability of the semiconductor wafer 400oo and comprise for example a thickness of greater than 250 µm at the beginning of the method for producing semiconductor components.

The wiring layer stack 140 of the semiconductor wafer 400 comprises a plurality of wiring structures which can contact the illustrated component region and at least some of which are arranged at least partly vertically above that part of the semiconductor substrate 102 which lies laterally between the component regions of the semiconductor wafer. At least two wiring structures comprise in each case a contact connection area arranged at the front side surface of the wiring layer stack 140, which are arranged vertically above that part of the semiconductor substrate 102 which lies laterally between the component regions of the semiconductor wafer.

The semiconductor substrate 102 can comprise highly resistive silicon (for example intrinsic silicon) in its bulk region, for example.

Figure 4B:
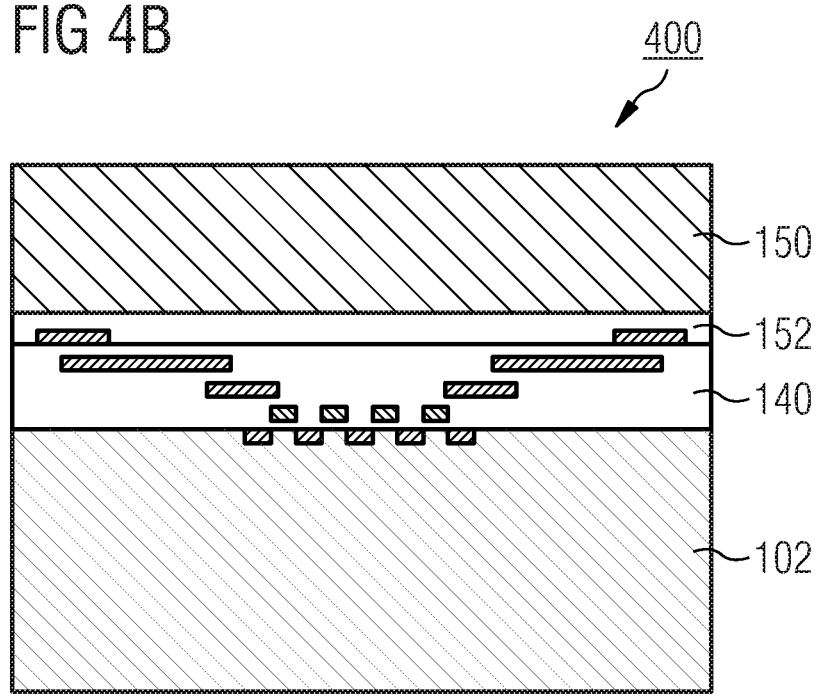

In FIG. 4b, a temporary carrier wafer 150 is applied by means of an intermediate layer 152 at the front side of the semiconductor wafer 400 (at the front side surface of the wiring layer stack 140 of the semiconductor wafer 400). The intermediate layer 152 can comprise for example a reversible lacquer releasable by heat or solvents, and/or a double-sided adhesive film releasable by heat or solvents, such that the temporary carrier wafer 150 can be reversibly applied to the semiconductor wafer 400. The temporary carrier wafer 150 can comprise a glass wafer, for example.

In FIG. 4c, the semiconductor substrate 102 of the semiconductor wafer 400 is thinned proceeding from a rear side surface of the semiconductor substrate 102 until, for example, only a thin part of the bulk region (for example thinner than 30 µm) is present between the structures of electrical elements of the component region and the rear side surface of the semiconductor substrate 102. After thinning, the semiconductor substrate 102 can comprise overall for example a thickness of less than 100 µm. Thinning can comprise for example grinding and/or polishing the semiconductor substrate 102. Moreover, in FIG. 4c, that part of the semiconductor substrate 102 which lies laterally between the component regions of the semiconductor wafer is removed (for example by anisotropic etching and using a photolithographic mask), such that the wiring layer stack 140 is exposed between the component regions and laterally around the illustrated component region (which now substantially corresponds to the rest of the semiconductor substrate 102). After thinning the semiconductor substrate 102 and after removing that part of the semiconductor substrate 102 which lies laterally between the component regions, it is possible for example for the temporary carrier wafer 150 to mechanically stabilize the semiconductor wafer 400.

In FIG. 4d, an insulation structure 120 is formed, which laterally encloses the illustrated component region and which can be arranged laterally between the component regions of the semiconductor wafer 400. Moreover, a part of the insulation structure 120 is arranged at the rear side surface of the component region (at the rear side surface of the semiconductor substrate 102). Moreover, in FIG. 4d, an electrically insulating carrier wafer 130 is connected to the insulation structure 120 permanently at a rear side surface of the insulation structure 120. The electrically insulating carrier wafer 130 can comprise a glass wafer, for example.

As illustrated schematically in FIG. 4e, since the electrically insulating carrier wafer 130 can mechanically stabilize the semiconductor wafer 400, it is then possible to remove the temporary carrier wafer 150 and also the intermediate layer 152 from the front side of the semiconductor wafer 400. Removing the temporary carrier wafer 150 can be carried out for example by supplying heat and/or by supplying solvent to the intermediate layer 152.

FIG. 4f shows a process of forming and/or applying copper pillars (also referred to as Copper Pillar Solder Bumps) and/or solder beads at the contact connection areas of the wiring structures of the semiconductor component to be produced. By way of example, a first copper pillar 149-1 can be formed and/or applied at a first contact connection area of a first wiring structure of the semiconductor component to be produced and a second copper pillar 149-2 can be formed and/or applied at a second contact connection area of a second wiring structure of the semiconductor component to be produced.

The copper pillars and/or the solder beads can serve for example at a later point in time to electrically and mechanically connect the semiconductor component to be produced to a printed circuit board or to a leadframe of a housing of the semiconductor component to be produced. In particular, copper pillars and/or solder beads at the contact connection areas can serve to connect the semiconductor component produced to a connection area (referred to as footprint) on a printed circuit board according to a flip-chip method. In this regard, the lengths of electrical connections from the printed circuit board to the semiconductor component produced could be reduced and, consequently, for example parasitic inductances of said electrical connections could also be reduced.

Figure 4G:
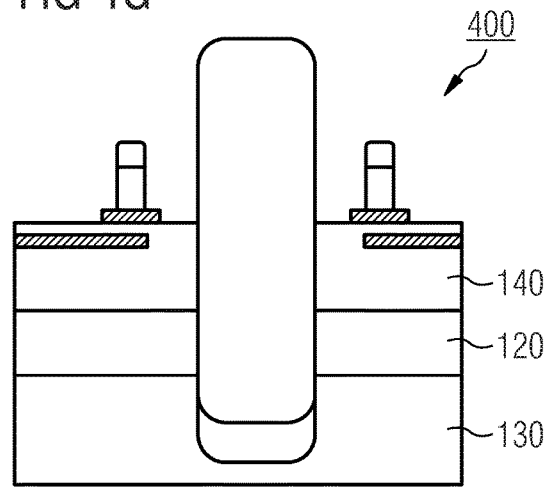

FIG. 4g shows a process of singulating semiconductor components from the semiconductor wafer 400. In this case, singulating takes place along a separating line in a region through the insulation structure 120, such that the singulated semiconductor components can comprise at least respectively one component region from the semiconductor wafer, which can be enclosed laterally by electrically insulating material of the insulation structure 120. The electrically insulating material can then extend for example from an edge of the at least one component region of the singulated semiconductor component laterally as far as an edge of the singulated semiconductor component.

Further details and aspects are mentioned in connection with the exemplary embodiments described above or below. The exemplary embodiments shown in FIG. 4a to FIG. 4g can in each case have one or more optional additional features corresponding to one or more aspects mentioned in connection with the proposed concept or one or more exemplary embodiments described above (e.g. FIGS. 1 to 3) or below.

Some exemplary embodiments relate to a radio-frequency circuit having improved linearity. The present disclosure provides for example a structure (for example a semiconductor component) without free charge carriers outside an active component region (for example a semiconductor substrate). This would make it possible for example to prevent a situation in which such free charge carriers could contribute to nonlinearities, losses and/or insulation restrictions.

Other components could reduce (parasitic) effects of free charge carriers in a semiconductor substrate for example with the aid of bulk silicon, radio-frequency silicon-on-insulator (RFSOI for short), and/or high bandgap semiconductors.

With the use of bulk silicon, for example highly resistive silicon can be used and interfacial charges could be reduced by compensation implants and/or by a trap-rich layer.

With the use of RFSOI, silicon-on-insulator (SOI for short) substrates and/or silicon-on-sapphire (SOS for short) substrates can be used, for example. SOI and/or SOS substrates can insulate components (for example structures of electrical elements) from the substrate. The substrate can be either an SOS substrate or an SOI substrate comprising highly resistive silicon and/or a trap-rich layer at an interface with a buried oxide (BOX for short).

With the use of high bandgap semiconductors, a semi-insulating semiconductor (for example gallium arsenide, GaAs) can be used, for example.

However, these three types of semiconductor components could all be restricted in their technical performance since they could not avoid residual charges (for example residual free charge carriers) which could interact with wiring structures and/or component regions and thereby cause nonlinearities, for example. Moreover, semiconductor components comprising SOI substrates, SOS substrates and/or high bandgap semiconductors could cause high costs for the substrate and/or high processing costs.

Alternatively, an SOI substrate can be used and the substrate can be etched according to a component process, such that only back-end-of-line structures (for example a wiring layer stack), a component region and a buried oxide remain. Afterward, an insulating wafer (for example an electrically insulating carrier wafer) can be applied using a wafer bonding method.

With reference to FIGS. 1 to 4 and the associated description, a first configuration comprises a semiconductor component 100, 200 comprising a semiconductor substrate 102, an insulation structure 120, wherein the insulation structure 120 encloses the semiconductor substrate 102 at least laterally, an electrically insulating carrier structure 130, wherein at least the insulation structure 120 is permanently connected to the electrically insulating carrier structure 130, wherein the insulation structure 120 comprises an electrically insulating material, wherein the electrically insulating material of the insulation structure 120 extends laterally from an edge of the semiconductor substrate 102 as far as an edge of the electrically insulating carrier structure 130, and at least one wiring structure 142, which is arranged in a wiring layer stack 140 of the semiconductor component and extends as far as the semiconductor substrate 102, wherein a part of the wiring structure 142 is arranged vertically above the insulation structure 120.

In accordance with a second configuration with reference to the first configuration, the wiring structure 142 comprises a contact connection area arranged vertically above the insulation structure 120.

In accordance with a third configuration with reference to at least one of the first and second configurations, a lateral total area of the electrically insulating carrier structure 130 is equal to a lateral total area of the semiconductor substrate 102 together with the insulation structure 120.

In accordance with a fourth configuration with reference to at least one of the first to third configurations, a lateral total area of the semiconductor substrate 102 is less than 80% of a lateral total area of the electrically insulating carrier structure 130.

In accordance with a fifth configuration with reference to at least one of the first to fourth configurations, a lateral total area of the semiconductor substrate 102 is greater than 20% of a lateral total area of the electrically insulating carrier structure 130.

In accordance with a sixth configuration with reference to at least one of the first to fifth configurations, a thickness of the semiconductor substrate 102 is less than 200 μm.

In accordance with a seventh configuration with reference to at least one of the first to sixth configurations, a thickness of the electrically insulating carrier structure 130 is greater than 250 μm.

In accordance with an eighth configuration with reference to at least one of the first to seventh configurations, the electrically insulating material of the insulation structure 120 extends laterally along the entire edge of the electrically insulating carrier structure 130.

In accordance with a ninth configuration with reference to at least one of the first to eighth configurations, the electrically insulating material of the insulation structure 120 extends vertically from the wiring layer stack 140 as far as the electrically insulating carrier structure 130.

In accordance with a tenth configuration with reference to at least one of the first to ninth configurations, a minimum width of the insulation structure 120 is greater than 500 μm.

In accordance with an eleventh configuration with reference to at least one of the first to tenth configurations, a part of the insulation structure 120 is arranged vertically between the semiconductor substrate 102 and the electrically insulating carrier structure 130.

In accordance with a twelfth configuration with reference to the eleventh configuration, a thickness of that part of the insulation structure 120 which is arranged vertically between the semiconductor substrate 102 and the electrically insulating carrier structure 130 is less than 50 μm.

In accordance with a thirteenth configuration with reference to at least one of the first to twelfth configurations, the electrically insulating material of the insulation structure 120 comprises at least one of benzocyclobutene, polymer-based molding material, glass solder, glass frit, silicon dioxide, silicon nitride and carbon.

In accordance with a fourteenth configuration with reference to at least one of the first to thirteenth configurations, a material of the electrically insulating carrier structure 130 is different than the electrically insulating material of the insulation structure 120.

In accordance with a fifteenth configuration with reference to at least one of the first to fourteenth configurations, the electrically insulating carrier structure 130 comprises at least one of glass and crystalline material.

In accordance with a sixteenth configuration with reference to at least one of the first to fifteenth configurations, the semiconductor component comprises a microwave circuit implemented at least partly in the semiconductor substrate.

In accordance with a seventeenth configuration, a method 300 for producing semiconductor components comprises the following steps: applying 310 a temporary carrier wafer on a front side of a semiconductor wafer, wherein the semiconductor wafer has at the front side a wiring layer stack arranged on a semiconductor substrate, wherein the semiconductor substrate has a plurality of component regions; removing 320 a part of the semiconductor substrate that lies laterally between the component regions, such that the wiring layer stack is exposed between the component regions; forming 330 an insulation structure, wherein the insulation structure is arranged at least laterally between the component regions and laterally encloses the component regions; and permanently connecting 340 an electrically insulating carrier wafer at least to the insulation structure at an opposite side of the component regions relative to the wiring layer stack.

In accordance with an eighteenth configuration with reference to the seventeenth configuration, the method furthermore comprises thinning the semiconductor substrate to a thickness of the semiconductor substrate of less than 200 μm before removing the part of the semiconductor substrate that lies laterally between the component regions.

In accordance with a nineteenth configuration with reference to at least one of the seventeenth to eighteenth configurations, during the process of permanently connecting 340 the electrically insulating carrier wafer to at least the insulation structure, the insulation structure is in a viscous state at the opposite side of the component regions relative to the wiring layer stack and cures during the process of permanently connecting 340.

In accordance with a twentieth configuration with reference to the seventeenth to nineteenth configurations, the method furthermore comprises singulating the semiconductor components by separation in a region of the insulation structure.

Figure 5:
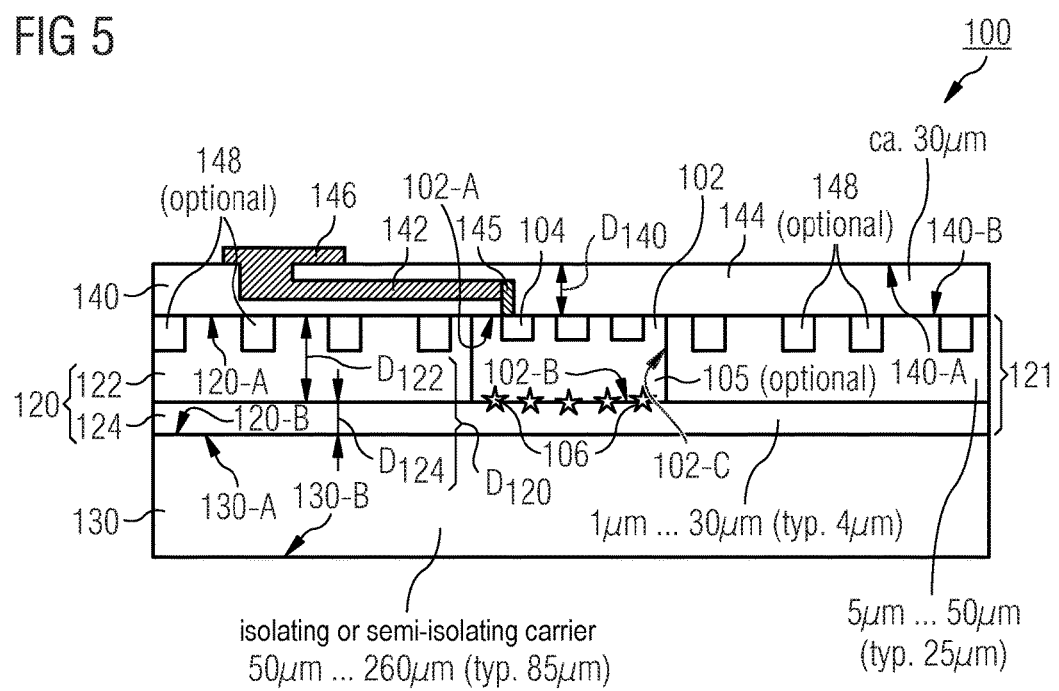
FIG. 5 shows a schematic cross-sectional illustration of an exemplary RF module in accordance with one exemplary embodiment.

FIG. 5 then shows a schematic illustration of a cross section of an RF module or semiconductor component 100 in accordance with a further exemplary embodiment. The RF module 100 can be implemented as an RF-SoHRC module (RF-SoHRC="RF Si on High Resistivity Carrier") comprising at least one bulk semiconductor substrate.

The RF module (RF=radio-frequency) 100 comprises a bulk semiconductor substrate 102 with at least one integrated RF component 104, which is integrated in a first main surface region 102-A of the bulk semiconductor substrate 102. The integrated RF component 104 can comprise e.g. at least one RF individual transistor and/or at least one RF diode. The bulk semiconductor substrate 102 furthermore comprises a second main surface region 102-B and an e.g. circumferential side surface region 102-C connecting the first and second main surface regions 102-A, 102-B.

A bulk semiconductor substrate 102 denotes a semiconductor substrate which was produced e.g. from a standard bulk semiconductor wafer, wherein the bulk semiconductor substrate 102 has for example a thickness $D_{102}$ of between 5 and 50 am, between 20 and 30 μm and typically of approximately 25 μm. Lateral dimensions perpendicular to the depicted thickness $D_{102}$ of the bulk semiconductor substrate 102 can be for example in the range of between 5 μm and 5 mm or between 50 μm and 500 μm; in this case, arbitrary geometries such as rectangles or polyhedra are possible. Arbitrary suitable semiconductor materials such as silicon (Si), gallium arsenide (GaAs), germanium (Ge), gallium nitride (GaN) etc. can be used as semiconductor material.

This enumeration of possible semiconductor materials should not be regarded as exhaustive, since any semiconductor materials suitable for the integration of RF components can be used for the bulk semiconductor substrate 102.

An insulator structure or insulation structure 120, which can have a layered construction, for example, laterally surrounds the side surface region 102-C of the bulk semiconductor substrate 102, wherein the insulation structure 120 furthermore comprises a first and a second, opposite main surface region 120-A, 120-B. The bulk semiconductor substrate 102 and the insulation structure 120 together form a first layer structure 121. The first layer structure 121 can have for example a thickness $D_{121}$ of between 5 and 100 μm, between 25 and 35 μm, or for example of approximately 30 μm.

A wiring layer stack 140, e.g. a BEOL layer stack (BEOL=back-end-of-line), as second layer structure, comprises at least one structured wiring structure or metallization layer 142 embedded in an insulation material 144, wherein the wiring layer stack 140 is arranged on the first main surface region 102-A of the bulk semiconductor substrate 102 and the first main surface region 120-A—adjoining the latter—of the insulation structure 120. The wiring layer stack 140 can furthermore comprise a plurality of structured wiring structures 142 embedded in the insulation material 144, or a layer sequence of insulation layers 144 and one or more structured wiring structures 142. The wiring layer stack 140 can have for example a thickness $D_{140}$ of between 3 and 30 μm, between 5 and 20 μm, or for example of approximately 10 μm.

BEOL process, in the course of which a BEOL layer stack is created, denotes in semiconductor processing the production section in which, after the FEOL process (FEOL=front-end-of-line) and optionally after an MOL process (MOL—mid-of-line), the wiring structures or metallization planes embedded into an insulation material are created above the processed semiconductor substrate. FEOL process denotes in semiconductor processing the production section in which the components integrated in the semiconductor substrate are produced.

The wiring structure 142 can comprise for example a contact connection area or a contact pad 146, which is arranged vertically above the insulation structure 120 and alongside the bulk semiconductor substrate 102, e.g. with regard to the perpendicular projection with respect to the first main surface region 120-A. The contact connection area 146 can be arranged at a first main surface or front side surface 140-A of the wiring layer stack 140 and provide an interface or a part of an interface to external electrical elements, for example to a printed circuit board, to a connection line, to other external semiconductor components and/or to passive external components.

The wiring layer stack 140 can furthermore comprise one or more plated-through holes or vias 145 between the wiring structure 142 to a second main surface 140-B of the wiring layer stack 140 and the RF component 104 in the bulk semiconductor substrate 102. If the wiring layer stack 140 comprises a plurality of metallization planes (not shown in FIG. 5), further plated-through holes can furthermore be provided between the different metallization planes and/or to the RF component 104 in the bulk semiconductor substrate 102.

The RF module 100 furthermore comprises a carrier structure 130 as a third layer structure, which is arranged at the second main surface region 120-B of the insulator structure 120 and is mechanically connected thereto, wherein the carrier structure 130 and the insulator structure 120 comprise different materials. The carrier structure 130 can have for example a thickness $D_{130}$ of between 40 and 300 μm, between 50 and 260 μm, between 70 and 100 μm or, for example, of approximately 85 μm.

To put it another way, the RF module 100 thus comprise a first, second and third layer structure 121, 130, 140 arranged one above another in a stack, wherein the first layer structure 121 comprises the insulation structure 120 and also the bulk semiconductor substrate 102 with at least one RF component 104 integrated therein, said bulk semiconductor substrate being embedded in the insulation structure 120. The insulator structure 120 surrounds the bulk semiconductor substrate regionally and at least laterally. The second layer structure 140 comprises the wiring layer stack 140 comprising at least one wiring structure 142 embedded in the insulation material 144, i.e. for example a layer sequence comprising the insulation layers 144 and the wiring structures 142, wherein the wiring layer stack 140 is arranged at the bulk semiconductor substrate 102 and the insulator structure 120 adjoining the latter. The third layer structure 130 comprises the carrier structure 130, wherein the carrier structure 130 and the insulator structure 120 comprise different materials.

In this case, the at least one RF component 104 is integrated in the first main surface region 102-A of the bulk semiconductor substrate 102, wherein the bulk semiconductor substrate furthermore comprises a second surface region 102-B and a side surface region 112-C, which laterally connects the first and second main surface regions. Furthermore, the insulator structure 120 laterally surrounds the side surface region 102-C of the bulk semiconductor substrate 102, wherein the insulator structure 120 furthermore comprises a first and second, opposite main surface region 120-A, 120-B.

As is illustrated in FIG. 5, the first main surface region 120-A of the insulator structure 120 can be formed or arranged flush, e.g. lying in one plane, with the first main surface region 102-A of the bulk semiconductor substrate.

Furthermore, the insulator structure 120 can also be arranged in a manner adjoining the second main surface region 102-B of the bulk semiconductor substrate 102, such that the insulator structure 120 surrounds the bulk semiconductor substrate 102 apart from the first main surface region 102-A of the bulk semiconductor substrate 102 or is arranged in a manner directly adjoining the latter.

As illustrated in FIG. 5, the insulator structure 120 can comprise a first material layer 122, which surrounds or laterally surrounds the side surface region 102-C of the bulk semiconductor substrate 102, and furthermore a second material layer 124, which is arranged between the first material layer 122 and the carrier structure 130 and also between the second main surface region 102-B of the bulk semiconductor substrate 102 and the carrier structure 130. In this case, the first material layer 122 and the second material layer 124 can comprise different materials or material compositions or different insulation materials or insulation material compositions.

The first material layer 122 has for example a thickness $D_{122}$ of between 5 and 50 µm, between 20 and 30 µm, and typically of approximately 25 µm, e.g. where $D_{122}=D_{102}$. The second material layer 124 has for example a thickness $D_{124}$ of between 0.5 and 50 µm, between 1 and 30 µm, between 1 and 30 µm and typically of approximately 4 µm, where $D_{121}=D_{122}+D_{124}$.

In accordance with a further exemplary embodiment, the insulator structure 120 can comprise only one continuous material layer, wherein the single material layer 120 surrounds the side surface region 102-C of the bulk semiconductor substrate 102 and also the second main surface region 102-B of the bulk semiconductor substrate, i.e. is arranged in a manner adjoining the side surface region 102-C and also the second main surface region 102-B of the bulk semiconductor substrate. In this further exemplary embodiment, therefore, by way of example, the first and second material layers 122, 124 from FIG. 5 can comprise the same material or the same material composition.

The insulator structure 120 can thus be formed as an uninterrupted layer comprising an insulation material with at least one material layer or with a plurality of material layers 122, 124. The insulator structure 120 can thus comprise one or a plurality of material layers 122, 124 comprising one common or a plurality of different materials or material compositions.

The electrically insulating material of the first and/or second material layer 122, 124 of the insulator structure 120 can comprise for example benzocyclobutene (BCB for short), polymer-based molding material, glass solder, glass frit, silicon dioxide ($SiO_2$), silicon nitride (SiN), carbon, a doped glass material e.g. having good flow properties at relatively high temperatures, epoxy-based composite materials, PMMA, WBA, polyimide or PDMS.

Furthermore, the second material layer 124 from FIG. 5 can be formed as an adhesive layer or adhesive e.g. based on a polymer material and/or epoxy material, in order to produce an adhesive connection between the carrier structure 130 and the first material layer 122 of the insulator structure 120. The insulator structure 120 can thus comprise one or a plurality of material layers 122, 124 comprising identical or a plurality of different materials or material compositions.

As is evident from FIG. 5, the insulator structure or insulation structure 120 also extends beneath the bulk semiconductor substrate 102, i.e. between the second main surface region 102-B of the bulk semiconductor substrate 102 and the carrier structure 130, in which case, however, the above description in connection with FIGS. 1 to 4 of the semiconductor component 100 is otherwise equally applicable to the RF module 100 from FIG. 5.

As is illustrated in FIG. 5, optional supporting elements 148, e.g. optional STI supporting locations (STI=Shallow Trench Isolation), can extend from the second surface region 140-B of the wiring layer stack 140 into the first material layer 122.

In accordance with a further exemplary embodiment, the insulator structure 120 can optionally comprise a structured insulation material 122, 124 comprising the supporting elements 148, e.g. supporting pillars or STI supporting locations (STI=Shallow Trench Isolation), between the wiring layer stack 140 and the carrier structure 130. As is illustrated in FIG. 5, the optional supporting elements 148 extend from the second surface region 140-B of the wiring layer stack 140 into the first material layer 122. The optional supporting elements 148 can be obtained for example during the front-end-of-line or else back-end-of-line process by virtue of the supporting elements 148 being introduced for example into the insulation material 122, 124 of the insulator structure 120. The supporting elements 148 can furthermore be formed in such a way that they extend in a manner proceeding from the second surface region 140-B of the wiring layer stack 140 as far as the second material layer 124 or as far as the first main surface region 130-A of the carrier structure 130 (not shown in FIG. 5). A second main surface 130-B of the carrier structure 130 forms for example a rear side surface of the RF module 100, while the first main surface 140-A of the wiring layer stack 140 forms for example a front side surface of the RF module.

The optional supporting elements 148 contribute for example to the lateral isolation between the bulk semiconductor substrate 102 and the surroundings thereof, e.g. adjacent further bulk semiconductor substrates 102-1, 102-2, . . . (cf. FIG. 6a).

The optional supporting elements 148 can furthermore be arranged to be positioned in larger regions outside the bulk semiconductor substrate 102 with the active components 104 as mechanical supporting locations composed of STI, in order to enable as far as possible optimal planarization of the main surface region 120-A of the insulator structure 120 and of the main surface region 102-A of the bulk semiconductor substrate 102 during a CMP process (CMP=chemical mechanical polishing). As a result, an intensified material removal (dishing) can be prevented for example during the CMP process.

Furthermore, the supporting elements 148 can take effect to enable an improved mechanical connection or mechanical anchoring of the connection material 120 to the bulk semiconductor substrate 102 (device wafer) and/or the carrier structure 130.

With the supporting elements 148 present between the wiring layer stack 140 and the carrier structure 130, it is possible in each case for example for the first or second material layer 122, 124 or the first and second material layers 122, 124 to be omitted or removed at least regionally or completely. This can be implemented depending on whether a sufficiently stable mechanical connection between the wiring layer stack 140 and the carrier structure 130 and a sufficiently stable mechanical fixing of the bulk semiconductor substrate 102 between the wiring layer stack 140 and the carrier structure 130 are obtained by means of the supporting elements 148.

Alternatively, the material of the first or second material layer 122, 124 or of the first and second material layers 122, 124 is also structurable in order itself to provide the supporting elements or supporting pillars 148 between the wiring layer stack 140 and the carrier structure 130.

For the case where the insulator structure 120 is formed with a structured insulation material, the (optional) supporting elements 148 between the wiring layer stack 140 and the carrier structure 130 can be surrounded by the materials mentioned above or else simply by air or surrounding atmosphere.

As was explained above, the bulk semiconductor substrate 102 can be obtained from a standard bulk semiconductor wafer, wherein one or a plurality of RF components 104 can be arranged in a manner adjoining the first main surface region 102-A of the bulk semiconductor substrate or can be integrated therein. Appropriate materials for the bulk semiconductor substrate include for example high bandgap semiconductors, such as e.g. silicon, etc., wherein other e.g. highly resistive semiconductor materials can also be used.

Substantially unavoidable interfacial or interface charges 106 (Qit=Interface Trap Charge Carriers) often form at the second main surface region 102-B of the bulk semiconductor substrate 102 adjoining the material of the insulator structure 120, e.g. adjoining the second material layer 124, wherein said interfacial charges are illustrated schematically by means of stars 10o6 in FIG. 5. On account of the relatively large thickness D102 of between 5 and 50 µm and typically between 25 and 35 µm of the bulk semiconductor substrate 102, e.g. in contrast to considerably thinner RF-SOI substrates, the interfacial charges 10o6 are relatively far away from the at least one active RF component 104, such that nonlinearities in the signal behavior of the RF components 104 that are caused by interfacial or interface charges Qit can be avoided to the greatest possible extent and the RF properties of the resulting RF module 100 and also the resulting linearity of the signal behavior of the RF module 100 can thus be significantly improved.

The bulk semiconductor substrate 102 can comprise for example a highly resistive bulk silicon material having for example an average doping density of less than 1015 cm-3 (or less than 1014 cm-3 or less than 1013 cm-3) and, resulting therefrom, e.g. a resistivity of 4 to 6 kΩ×cm for a doping density of less than 1013 cm-3. Alternatively, the bulk semiconductor substrate 102 can comprise an intrinsic (intrinsically conducting) semiconductor material. Furthermore, the semiconductor material of the bulk semiconductor substrate 102 can be substantially fully depleted of free charge carriers in the depth direction in the direction of the second main surface region 102-B by application of a depletion layer voltage of a few volts, e.g. 4-6 volts.

By virtue of this low doping concentration or by virtue of the absence of dopants in the bulk region, parasitic effects proceeding from the bulk region of the semiconductor substrate 102 can be avoided or at least reduced. With the use of bulk silicon, highly resistive silicon can be used, for example, wherein interfacial charges can be reduced e.g. by means of a compensation implant and/or by means of a trap-rich layer.

On account of the use of the bulk semiconductor substrate 102 for the RF module 100, it is furthermore possible also to process the rear side 102-B, i.e. the second main surface region 102-B, of the bulk semiconductor substrate 102, i.e. to arrange there integrated circuit elements (e.g. RF components—not shown in FIG. 5). The use of a high-resistance substrate material for the bulk semiconductor substrate 102 enables the resulting space charge zone to extend substantially completely into the depth of the bulk semiconductor substrate 102 through the relatively lightly doped substrate material as far as the second main surface region 102-B, such that a very low resulting substrate capacitance can furthermore be obtained for the RF module 100.

On account of the embedding of the bulk semiconductor substrate 102 at the second main surface region and the side surface region 102-B, 102-C in the insulator structure 120 and at the first main surface region 102-A of the bulk semiconductor substrate 102 below the specially configured wiring layer stack 140, it is possible to obtain an RF module 100 having a very high linearity and very low losses of the RF circuit sections 102. In particular, the capacitive and inductive interaction of the active and passive components or RF components among one another and e.g. via connecting elements with the semiconductor substrate can be prevented or at least reduced by virtue of the present construction of the RF module 100.

In particular, the number of free charge carriers outside the active components 104 in the bulk semiconductor substrate 102 or in the adjoining regions can be significantly reduced or almost completely eliminated, such that nonlinearities, losses and insulation restrictions caused by free charge carriers can be significantly reduced. In particular, a disturbing interaction with the semiconductor substrate can be reduced. Furthermore, the component-to-component isolation property and breakdown property of the resulting RF module 100 can be significantly increased and the RF signal behavior thereof can thus be significantly improved.

The wiring structure 142 embedded in the insulation material 144 of the wiring layer stack 140 (BEOL layer stack) can furthermore comprise or form an RF wiring structure, wherein at least a proportion of 60%, 80%, 90%, 95% or 99% of the RF wiring structure (for example comprising a relatively thick conductive layer) of the wiring layer stack 140 is arranged above the insulator structure 120 with regard to a perpendicular projection with respect to the first main surface region 120-A of the insulator structure 120, that is to say that less than 40%, 30%, 20%, 10%, 5% or 1% of the RF wiring structure (with regard to the perpendicular projection with respect to the first main surface region 120-A) is arranged above the bulk semiconductor substrate 102.

The structured metallization layer can furthermore comprise a DC wiring structure (for DC supply). In this case, the wiring structure can be configured such that the largest possible proportion of the DC supply plane is arranged vertically above the insulator structure 120 (above with regard to a perpendicular projection with respect to the first main surface region 120-A of the insulator structure 120). With regard to the DC supply plane, however, in general the requirements that should be taken into consideration are not as stringent as those regarding the RF wiring structure.

Furthermore, passive circuit elements (not shown in FIG. 5) of the radio-frequency module 100 can be arranged in the wiring layer stack. By way of example, inductors, MIM capacitors (MIM=metal-insulation-metal) and resistors, e.g. comprising poly-Si or metals, metal mixtures or compounds comprising metal and nitrogen and/or oxygen, can be used as passive circuit elements. In this regard, by way of example, once again an (areal) proportion of at least 60%, 80%, 90%, 95% or 99% and up to 100% of the passive circuit elements can be arranged above the insulator structure 120 with regard to a perpendicular projection with respect to the first main surface region 120-A of the insulator structure 120.

Furthermore, optionally a logic block 105 can be arranged at the first main surface region 102-A of the bulk semiconductor substrate 102 or be integrated therein and form an integrated RF circuit arrangement with the at least one RF component 104 connected to the logic block 105. By way of example, a digital interface, a level shifter, an analog-to-digital converter or digital-to-analog converter, a digital controller, etc. can be used as logic block 105.

In accordance with one exemplary embodiment, a plurality of RF components 104 can be arranged in a manner adjoining the first main surface region 102-A of the bulk semiconductor substrate 104 or be integrated therein. In accordance with a further exemplary embodiment, the logic block 105 can also be arranged in a "dedicated" bulk semiconductor substrate (not shown in FIG. 5), i.e. in a bulk semiconductor substrate separate from the bulk semiconductor substrate 102. In this case, it is possible to provide an electrical connection between the RF component 104 and the logic block 105 via the wiring structure 142 in the wiring layer stack 140o. This will be explained in further detail below with reference to FIGS. 6a and 6b.

The carrier structure 130 comprises a material having a sufficient mechanical stability and is thus formed in a sufficiently rigid fashion to offer a mechanical support of the RF module 100. In this regard, the carrier structure 130 is designed to serve for example as an abutment when the RF module is equipped e.g. with passive components, e.g. vis à vis forces that are exerted on the front side—the wiring layer stack 140. This is the case for example during wire bond processes and flip-chip connection processes.

The carrier structure 130 can comprise for example an isolating or semi-isolating carrier material, such as e.g. a glass material, a ceramic material, a crystalline material and/or a highly insulating semiconductor material, e.g. a highly insulating silicon material. The carrier structure 130 can be formed as a stiffening element for the RF module 100.

FIG. 5 shows one exemplary embodiment of an RF module comprising one bulk semiconductor substrate 102. In accordance with further exemplary embodiments, the RF module 100 can furthermore comprise a plurality of bulk semiconductor modules (not shown in FIG. 5), which can be formed in each case like the bulk semiconductor substrate 102 described above and which can be surrounded by the insulator structure 120 at the respective side surface regions and the second main surface regions.

Figure 6A:
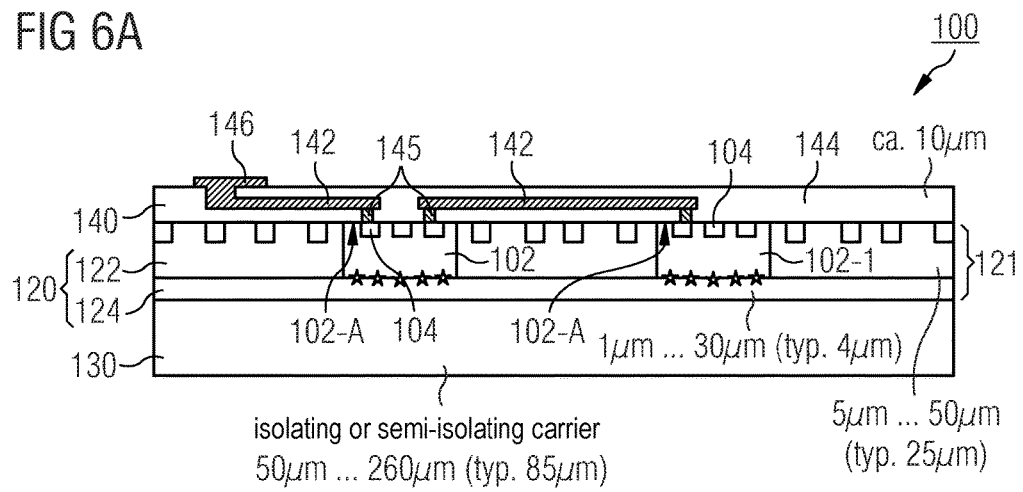
FIG. 6a shows a schematic cross-sectional illustration of an exemplary RF module in accordance with one exemplary embodiment.

FIG. 6a shows a schematic cross-sectional illustration of an exemplary RF module 100 in accordance with one exemplary embodiment comprising a plurality of bulk semiconductor substrates 102 and 102-1. The RF module 100 can be implemented as an RF-SoHRC module (RF-SoHRC="RF Si on High Resistivity Carrier") comprising at least one bulk semiconductor substrate. The RF module 100 can also be implemented as an RF-SOG module (SOG=silicon on glass) comprising at least one bulk semiconductor substrate.

In accordance with a further exemplary embodiment, the logic block 105 can also be arranged in a "dedicated" bulk semiconductor substrate (not shown in FIG. 5), wherein it is possible to provide an electrical connection between the two separately arranged bulk semiconductor substrates 102, 102-1 via the wiring structure 142 in the wiring layer stack 140.

The wiring structure 142 embedded in the insulation material 144 of the wiring layer stack 140 (BEOL layer stack) can furthermore comprise or form the RF wiring structure, wherein at least a proportion of 60% of the RF wiring structure of the wiring layer stack 140 is arranged above the insulator structure 120, that is to say that less than 40% of the RF wiring structure is arranged above the bulk semiconductor substrate 102.

As is evident from FIG. 6a, the wiring layer stack 140 extends to the plurality of bulk semiconductor substrates 102, 102-1, in which case, however, the above description in connection with FIG. 5 of the RF module 100 comprising one bulk semiconductor substrate 102 is otherwise equally applicable to the RF module 100 comprising a plurality of bulk semiconductor substrates 102, 102-1 from FIG. 6a.

Figure 6B:
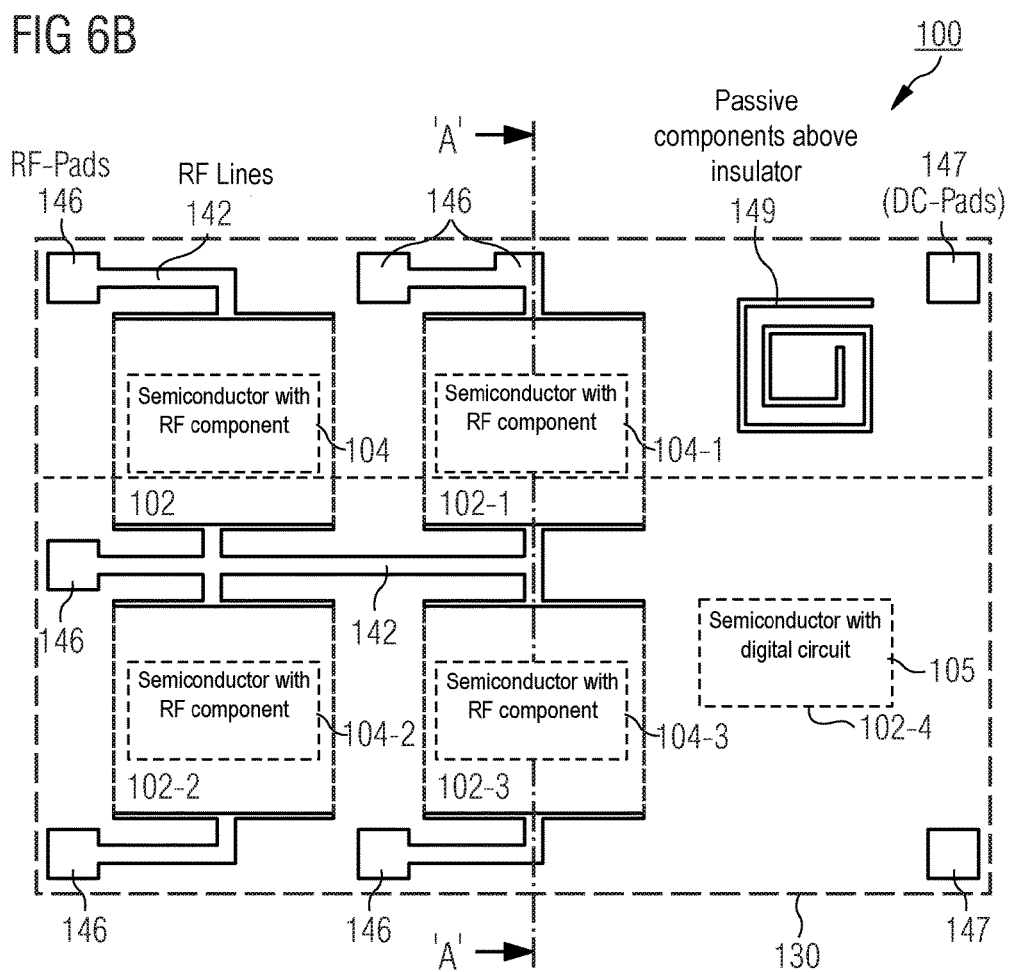
FIG. 6b shows a schematic plan view of an exemplary RF module in accordance with one exemplary embodiment.

FIG. 6b shows a schematic plan and phantom view of an exemplary RF module 100 in accordance with the exemplary embodiment from FIG. 6a, wherein FIG. 6a is for example a sectional view of the RF module from FIG. 6b along the sectional line AA. In the schematic plan view of the exemplary RF module 100 from FIG. 6b, the insulation material 144 of the wiring layer stack 140 has been omitted in order to simplify the illustration.

As shown in FIG. 6b, the RF module 100 in accordance with one exemplary embodiment can comprise a plurality of bulk semiconductor substrates 102, 102-1, 102-2 and 102-3. Furthermore, the logic block 105 can also be arranged in a "dedicated" bulk semiconductor substrate 102-4, wherein it is possible to provide an electrical connection between the separately arranged bulk semiconductor substrates 102, 102-1, 102-2, 102-3, 102-4 via the metallization structure 142 in the wiring layer stack 140. By way of example, a digital interface, a level shifter, an analog-to-digital converter or digital-to-analog converter, a digital controller, etc. can be used as logic block 105.

FIG. 6b illustrates, in principle, that the structured metallization layer 142, which is embedded in the insulation material 144 (not shown in FIG. 6b) of the wiring layer stack 140 (BEOL layer stack) and can comprise the RF wiring structure, is arranged above the insulator structure 120 at least to the extent of 60%, 80% or 90%, i.e. at least with a proportion of 60% of the RF wiring structure of the wiring layer stack 140. Thus for example less than 40% of the RF wiring structure is arranged above the respective bulk semiconductor substrate 102, 102-1, 102-2 and 102-3.

The wiring layer stack 140 can furthermore comprise a DC wiring structure e.g. for DC supply, which contains e.g. DC connection areas or DC pads 147 (DC=direct current). In this case, the DC wiring structure can be configured such that the largest possible proportion of elements situated in the DC supply structure are arranged above the insulator structure 120 vertically above with regard to a perpendicular projection with respect to the first main surface region 120-A of the insulator structure 120. With regard to the DC supply structure, however, often there is no need to take into consideration requirements as stringent as those regarding the RF wiring structure.

Furthermore at least one passive circuit element 149 or furthermore a plurality of passive circuit elements 149 of the radio-frequency module 100 can be arranged in the wiring layer stack 140. In this regard, by way of example, once again an areal proportion of at least 60%, 80%, 90%, 95% or 99% and up to 100% of the passive circuit elements 149 can be arranged above the insulator structure 120 with regard to a perpendicular projection with respect to the first main surface region 120-A of the insulator structure 120.

With reference to FIGS. 5, 6a and 6b and the associated description, a first aspect comprises an RF module having the following features: a bulk semiconductor substrate 102 with at least one integrated RF component 104, which is integrated in a first main surface region 102-A of the bulk semiconductor substrate 102, wherein the bulk semiconductor substrate furthermore comprises a second main surface region 102-B and a side surface region 102-C, an insulator structure 120, which surrounds the side surface region 102-C of the bulk semiconductor substrate, wherein the insulator structure 120 furthermore comprises a first and second opposite main surface region 120-A, 120-B, a wiring layer stack 140 comprising at least one structured metallization layer 142 embedded into an insulation material 144, said wiring layer stack being arranged on the first main surface region 102-A of the bulk semiconductor substrate 102 and the first main surface region 120-A—adjoining the latter—of the insulator structure 120, and a carrier structure 130 at the second main surface region 120-B of the insulator structure 120, wherein the carrier structure 130 and the insulator structure 120 comprise different materials.

In accordance with a second aspect with reference to the first aspect, the first main surface region 120-A of the insulator structure 120 is formed flush with the first main surface region 102-A of the bulk semiconductor substrate 102-A.

In accordance with a third aspect with reference to the first aspect, the insulator structure 120 is furthermore arranged at the second main surface region 102-B of the bulk semiconductor substrate 102-A.

In accordance with a fourth aspect with reference to the first aspect, the insulator structure 120 comprises a first material layer 122, which surrounds the side surface region 102-C of the bulk semiconductor substrate 102-A, and furthermore comprises a second material layer 124, which is arranged between the first material layer 122 and the carrier structure 130 and also between the second main surface region 102-B of the bulk semiconductor substrate 102-A and the carrier structure 130.

In accordance with a fifth aspect with reference to the fourth aspect, the first material layer 122 and the second material layer 124 comprise different insulation materials or insulation material compositions.

In accordance with a sixth aspect with reference to the first aspect, the insulator structure 120 comprises a material layer surrounding the side surface region 102-C and also the second main surface region 102-B of the bulk semiconductor substrate 102.

In accordance with a seventh aspect with reference to the first aspect, the insulator structure 120 is formed as a continuous layer comprising an insulation material.

In accordance with an eighth aspect with reference to the first aspect, the insulator structure 120 comprises a structured insulation material 148 comprising supporting elements between the wiring layer stack 140 and the carrier structure 130.

In accordance with a ninth aspect with reference to the first aspect, the insulator structure 120 comprises at least one electrically insulating material from a group of materials, wherein the group of materials comprises benzocyclobutene, polymer-based boron material, glass solder, glass frit, silicon dioxide, silicon nitride, carbon, doped glass materials, epoxy-based composite materials, PMMA, WBA, polyimide and PDMS.

In accordance with a tenth aspect with reference to the first aspect, the structured metallization layer 142 comprises an RF wiring structure, wherein at least a proportion of 60% of the RF wiring structure of the wiring layer stack 140 is arranged above the insulator structure 120.

In accordance with an eleventh aspect with reference to the first aspect, passive circuit elements are arranged in the wiring layer stack 140.

In accordance with a twelfth aspect with reference to the eleventh aspect, at least an areal proportion of 80% of the passive circuit elements is arranged above the insulator structure 120.

In accordance with a thirteenth aspect with reference to the first aspect, a logic block 105 is furthermore arranged at the bulk semiconductor substrate 102-A and forms an integrated RF circuit arrangement with the at least one RF module 104 assigned to the logic block 105.

In accordance with a fourteenth aspect with reference to the first aspect, the carrier structure 130 comprises an isolating or a semi-isolating carrier material.

In accordance with a fifteenth aspect with reference to the first aspect, the carrier structure 130 is formed as a stiffening element for the RF module 100.

In accordance with a sixteenth aspect with reference to the first aspect, the bulk semiconductor substrate has a thickness of between 5 and 50 µ, wherein the insulator structure has a thickness of between 5 and 100 µm, wherein the wiring layer stack 140 has a thickness of between 5 and 50 µm, and wherein the carrier structure 130 has a thickness of between 50 and 300 µm.

In accordance with a seventeenth aspect with reference to the first aspect, the RF module 100 comprises a plurality of bulk semiconductor substrates 102-A, ... 102-E, which are surrounded by the insulator structure 120 in each case at the side surface regions and the second main surface regions.

In accordance with an eighteenth aspect, an RF module 100 comprises a first, second and third layer structure 120, 130, 140 arranged one above another in a stack, wherein the first layer structure 120 comprises the bulk semiconductor substrate 102 with at least one RF component 104 integrated therein, and also an insulator structure 120, which regionally surrounds the bulk semiconductor substrate, wherein the second layer structure 140 is a wiring layer stack comprising at least one structured metallization layer 142 embedded in an insulation material 144, said wiring layer stack being arranged at the bulk semiconductor substrate 102 and the insulator structure 120 adjoining the latter, and wherein the third layer structure is a carrier structure, wherein the carrier structure 130 and the insulator structure 120 comprise different materials.

In accordance with a nineteenth aspect with reference to the eighteenth aspect, the at least one RF component 104 is integrated in a first main surface region 102-A of the bulk semiconductor substrate 102, wherein the bulk semiconductor substrate 102-A furthermore comprises a second main surface region 102-B and a side surface region 102-C, wherein the insulator structure 120 surrounds the side surface region 102-C of the bulk semiconductor substrate 102 and is furthermore arranged at the second main surface region 102-B of the bulk semiconductor substrate 102, and wherein the insulator structure 120 furthermore comprises a first and second, opposite main surface region 120-A, 120-B.

In accordance with a twentieth aspect with reference to the eighteenth aspect, the insulator structure 120 comprises a first material layer 122, which surrounds the side surface region 102-C of the bulk semiconductor substrate 102-A, and furthermore comprises a second material layer 124, which is arranged between the first material layer 122 and the carrier structure 130 and also between the second main surface region 102-B of the bulk semiconductor substrate 102-A and the carrier structure 130.

In accordance with a twenty-first aspect with reference to the eighteenth aspect, the insulator structure 120 comprises a material layer surrounding the side surface region 102-C and also the second main surface region 102-B of the bulk semiconductor substrate 102.

In accordance with a twenty-second aspect with reference to the eighteenth aspect, the structured metallization layer 142 comprises an RF wiring structure, wherein at least a proportion of 60% of the RF wiring structure of the wiring layer stack 140 is arranged above the insulator structure 120.

In accordance with a twenty-third aspect with reference to the eighteenth aspect, passive circuit elements are arranged in the wiring layer stack 140, wherein at least an areal proportion of 60% of the passive circuit elements is arranged above the insulator structure 120.

In accordance with a twenty-fourth aspect with reference to the eighteenth aspect, a logic block 105 is furthermore arranged at the bulk semiconductor substrate 102-A and forms an integrated RF circuit arrangement with the at least one RF module 104 assigned to the logic block 105.

In accordance with a twenty-fifth aspect with reference to the eighteenth aspect, the RF module 100 comprises a plurality of bulk semiconductor substrates 102, 102-1, . . . 102-4, which are surrounded by the insulator structure 120 in each case at the side surface regions and the second main surface regions.

Exemplary embodiments can furthermore provide a computer program comprising a program code for carrying out one of the methods above when the computer program is executed on a computer or processor. A person skilled in the art would readily recognize the steps of various methods described above can be carried out by programmed computers. In this case, some exemplary embodiments are intended also to cover program storage devices, e.g. digital data storage media, which are machine- or computer-readable and code machine-executable or computer-executable programs of instructions, wherein the instructions carry out some or all of the steps of the methods described above. The program storage devices can be e.g. digital memories, magnetic storage media such as, for example, magnetic disks and magnetic tapes, hard disk drives or optically readable digital data storage media. Moreover, further exemplary embodiments are intended to cover computers programmed to carry out the steps of the methods described above or (field) programmable logic arrays ((F)PLA) or (field) programmable gate arrays ((F)PGA) programmed to carry out the steps of the methods described above.

Advantageous aspects of some embodiments include RF modules having improved operating properties that can be implemented cost-effectively.

The description and drawings present only the principles of the disclosure. It goes without saying, therefore, that the person skilled in the art can derive various arrangements which, although not expressly described or illustrated here, embody the principles of the disclosure and are contained within the meaning and scope thereof. Furthermore, all examples mentioned here are intended to be used in principle only for teaching purposes, in order to assist the reader in understanding the principles of the disclosure and the concepts contributed by the inventor(s) for further development of the art, and are intended to be interpreted as serving not to limit such particularly mentioned examples and conditions. Furthermore, all statements herein regarding principles, aspects and exemplary embodiments of the disclosure and also particular examples thereof are intended to encompass the counterparts thereof.

The person skilled in the art should understand that all block diagrams herein illustrate conceptual views of exemplary circuits which embody the principles of the disclosure. Similarly, it goes without saying that all flow diagrams, flow charts, state transition diagrams, pseudo-code and the like illustrate various processes which are substantially represented in a computer-readable medium and thus performed by a computer or processor, regardless of whether such a computer or processor is expressly illustrated.

Furthermore, the claims that follow are hereby incorporated in the detailed description, where each claim can be representative of a separate exemplary embodiment by itself. If each claim can be representative of a separate exemplary embodiment by itself, it should be taken into consideration that—although a dependent claim can refer in the claims to a particular combination with one or more other claims—other exemplary embodiments can also include a combination of the dependent claim with the subject matter of any other dependent or independent claim. These combinations are proposed here, provided that no indication is given that a specific combination is not intended. Furthermore, features of a claim are intended also to be included for any other independent claim, even if this claim is not made directly dependent on the independent claim.

It should furthermore be taken into consideration that methods disclosed in the description or in the claims can be implemented by a device comprising means for carrying out each of the respective steps of said methods.

Furthermore, it goes without saying that the disclosure of multiple steps or functions disclosed in the description or the claims should not be interpreted as being in the specific order. The disclosure of multiple steps or functions therefore does not limit them to a specific order, unless said steps or functions are not interchangeable for technical reasons. Furthermore, in some exemplary embodiments, an individual step can include a plurality of substeps or be subdivided into them. Such substeps can be included and be part of the disclosure of said individual step, provided that they are not expressly excluded.

What is claimed is:

1. An RF module comprising:
    a bulk semiconductor substrate with at least one integrated RF component integrated in a first main surface region of the bulk semiconductor substrate wherein the bulk semiconductor substrate furthermore comprises a second main surface region and a side surface region;
    an insulator structure surrounding the side surface region of the bulk semiconductor substrate, wherein the insulator structure comprises a first main surface region and second main surface region;
    a wiring layer stack comprising at least one structured metallization layer embedded into an insulation material, the wiring layer stack being arranged on the first main surface region of the bulk semiconductor substrate and the first main surface region of the insulator structure, wherein the first main surface region of the bulk semiconductor substrate adjoins the first main surface region of the insulator structure; and
    a carrier structure at the second main surface region of the insulator structure, wherein the carrier structure and the insulator structure comprise different materials.

2. The RF module as claimed in claim 1, wherein the first main surface region of the insulator structure is formed flush with the first main surface region of the bulk semiconductor substrate.

3. The RF module as claimed in claim 1, wherein the insulator structure is furthermore arranged at the second main surface region of the bulk semiconductor substrate.

4. The RF module as claimed in claim 1, wherein the insulator structure comprises:
a first material layer surrounding the side surface region of the bulk semiconductor substrate; and
a second material layer arranged between the first material layer and the carrier structure and also arranged between the second main surface region of the bulk semiconductor substrate and the carrier structure.

5. The RF module as claimed in claim 4, wherein the first material layer and the second material layer comprise different materials or material compositions.

6. The RF module as claimed in claim 1, wherein the insulator structure comprises a material layer surrounding the side surface region and surrounding the second main surface region of the bulk semiconductor substrate.

7. The RF module as claimed in claim 1, wherein the insulator structure is formed as a continuous layer comprising an insulation material.

8. The RF module as claimed in claim 1, wherein the insulator structure comprises a structured insulation material comprising at least one supporting element between the wiring layer stack and the carrier structure.

9. The RF module as claimed in claim 1, wherein the insulator structure comprises at least one electrically insulating material from a group of materials, wherein the group of materials comprises benzocyclobutene, polymer-based boron material, glass solder, glass frit, silicon dioxide, silicon nitride, carbon, doped glass materials, epoxy-based composite materials, PMMA, WBA, polyimide and PDMS.

10. The RF module as claimed in claim 1, wherein:
the structured metallization layer comprises an RF wiring structure; and
at least a proportion of 80% of the RF wiring structure of the wiring layer stack is arranged above the insulator structure.

11. The RF module as claimed in claim 1, wherein at least one passive circuit element is arranged in the wiring layer stack.

12. The RF module as claimed in claim 11, wherein at least an areal proportion of 60% of the at least one passive circuit element is arranged above the insulator structure.

13. The RF module as claimed in claim 1, wherein a logic block is arranged at the bulk semiconductor substrate and forms an integrated RF circuit arrangement with the at least one integrated RF component assigned to the logic block.

14. The RF module as claimed in claim 1, wherein the carrier structure comprises an isolating or a semi-isolating carrier material.

15. The RF module as claimed in claim 1, wherein the carrier structure is formed as a stiffening element for the RF module.

16. The RF module as claimed in claim 1, wherein:
the bulk semiconductor substrate has a thickness of between 5 and 50 µm;
the insulator structure has a thickness of between 5 and 100 µm;
the wiring layer stack has a thickness of between 5 and 50 µm; and
the carrier structure has a thickness of between 50 and 300 µm.

17. The RF module as claimed in claim 1, further comprising a plurality of bulk semiconductor substrates surrounded by the insulator structure in each case at the side surface regions and the second main surface regions.

18. The RF module as claimed in claim 17, comprising a plurality of bulk semiconductor substrates surrounded by the insulator structure in each case at the side surface regions and the second main surface regions.

19. An RF module comprising:
a first, second and third layer structure arranged one above another in a stack, wherein:
the first layer structure comprises a bulk semiconductor substrate with at least one RF component integrated therein, and an insulator structure regionally surrounding the bulk semiconductor substrate,
the second layer structure comprises a wiring layer stack comprising at least one structured metallization layer embedded in an insulation material, the wiring layer stack being arranged at the bulk semiconductor substrate and the insulator structure adjoining the bulk semiconductor substrate, and
the third layer structure comprises a carrier structure, wherein the carrier structure and the insulator structure comprise different materials.

20. The RF module as claimed in claim 19, wherein:
the at least one RF component is integrated in a first main surface region of the bulk semiconductor substrate;
the bulk semiconductor substrate furthermore comprises a second main surface region and a side surface region;
the insulator structure surrounds the side surface region of the bulk semiconductor substrate and is arranged at the second main surface region of the bulk semiconductor substrate; and
the insulator structure furthermore comprises a first and second, opposite main surface region.

21. The RF module as claimed in claim 20, wherein the insulator structure comprises a first material layer surrounding the side surface region of the bulk semiconductor substrate, and a second material layer arranged between the first material layer and the carrier structure and also between the second main surface region of the bulk semiconductor substrate and the carrier structure.

22. The RF module as claimed in claim 20, wherein the insulator structure comprises a material layer surrounding the side surface region and also surrounding the second main surface region of the bulk semiconductor substrate.

23. The RF module as claimed in claim 19, wherein:
the structured metallization layer comprises an RF wiring structure; and
at least a proportion of 60% of the RF wiring structure of the wiring layer stack is arranged above the insulator structure.

24. The RF module as claimed in claim 19, wherein:
passive circuit elements are arranged in the wiring layer stack; and
at least an areal proportion of 60% of the passive circuit elements is arranged above the insulator structure.

25. The RF module as claimed in claim 19, wherein a logic block is arranged at the bulk semiconductor substrate and forms an integrated RF circuit arrangement with the at least one RF component assigned to the logic block.

* * * * *